(12) United States Patent
Kwak et al.

(10) Patent No.: US 7,247,528 B2
(45) Date of Patent: *Jul. 24, 2007

(54) METHODS OF FABRICATING SEMICONDUCTOR INTEGRATED CIRCUITS USING SELECTIVE EPITAXIAL GROWTH AND PARTIAL PLANARIZATION TECHNIQUES

(75) Inventors: Kun-Ho Kwak, Gyeonggi-do (KR); Jae-Hoon Jang, Gyeonggi-do (KR); Soon-Moon Jung, Gyeonggi-do (KR); Won-Seok Cho, Gyeonggi-do (KR); Hoon Lim, Seoul (KR); Sung-Jin Kim, Gyeonggi-do (KR); Byung-Jun Hwang, Gyeonggi-do (KR); Jong-Hyuk Kim, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 11/065,750

(22) Filed: Feb. 24, 2005

(65) Prior Publication Data

US 2005/0184292 A1    Aug. 25, 2005

(30) Foreign Application Priority Data

Feb. 24, 2004  (KR) .................. 10-2004-0012400
Sep. 8, 2004   (KR) .................. 10-2004-0071886

(51) Int. Cl.
*H01L 21/00*    (2006.01)

(52) U.S. Cl. .................. 438/149; 438/150; 438/197; 438/489; 438/626; 257/67; 257/68

(58) Field of Classification Search ............... 438/150, 438/489, 637, 672, 675, 629, 149, 197; 257/67, 257/68, 69, 347
See application file for complete search history.

(56) References Cited

U.S. PATENT DOCUMENTS

| 4,498,226 | A |   | 2/1985 | Inoue et al. |         |
|-----------|---|---|--------|--------------|---------|
| 4,670,088 | A | * | 6/1987 | Tsaur et al. | 117/45  |
| 5,122,476 | A | * | 6/1992 | Fazan et al. | 438/241 |
| 5,124,276 | A | * | 6/1992 | Samata et al.| 438/607 |

(Continued)

FOREIGN PATENT DOCUMENTS

KR    1999-0085769    12/1999

(Continued)

*Primary Examiner*—Thao P. Le
(74) *Attorney, Agent, or Firm*—Marger Johnson & McCollom, P.C.

(57) ABSTRACT

Methods of fabricating a semiconductor integrated circuit having thin film transistors using an SEG technique are provided. The methods include forming an inter-layer insulating layer on a single-crystalline semiconductor substrate. A single-crystalline semiconductor plug extends through the inter-layer insulating layer, and a single-crystalline epitaxial semiconductor pattern is in contact with the single-crystalline semiconductor plug on the inter-layer insulating layer. The single-crystalline epitaxial semiconductor pattern is at least partially planarized to form a semiconductor body layer on the inter-layer insulating layer, and the semiconductor body layer is patterned to form a semiconductor body. As a result, the semiconductor body includes at least a portion of the single-crystalline epitaxial semiconductor pattern. Thus, the semiconductor body has an excellent single-crystalline structure. Semiconductor integrated circuits fabricated using the methods are also provided.

33 Claims, 21 Drawing Sheets

U.S. PATENT DOCUMENTS

| | | |
|---|---|---|
| 5,852,310 A | 12/1998 | Kadosh et al. |
| 6,022,766 A | 2/2000 | Chen et al. |
| 6,180,453 B1 * | 1/2001 | Sung et al. ................. 438/256 |
| 6,620,659 B2 | 9/2003 | Emmma et al. |
| 2005/0133789 A1 * | 6/2005 | Oh et al. ....................... 257/66 |
| 2005/0221544 A1 * | 10/2005 | Kwak et al. ................. 438/150 |
| 2005/0277235 A1 * | 12/2005 | Son et al. .................... 438/166 |
| 2006/0048702 A1 * | 3/2006 | Son et al. ...................... 117/94 |
| 2006/0097319 A1 * | 5/2006 | Kim et al. .................. 257/353 |

FOREIGN PATENT DOCUMENTS

| | | |
|---|---|---|
| KR | 2001-0063623 | 7/2001 |

* cited by examiner

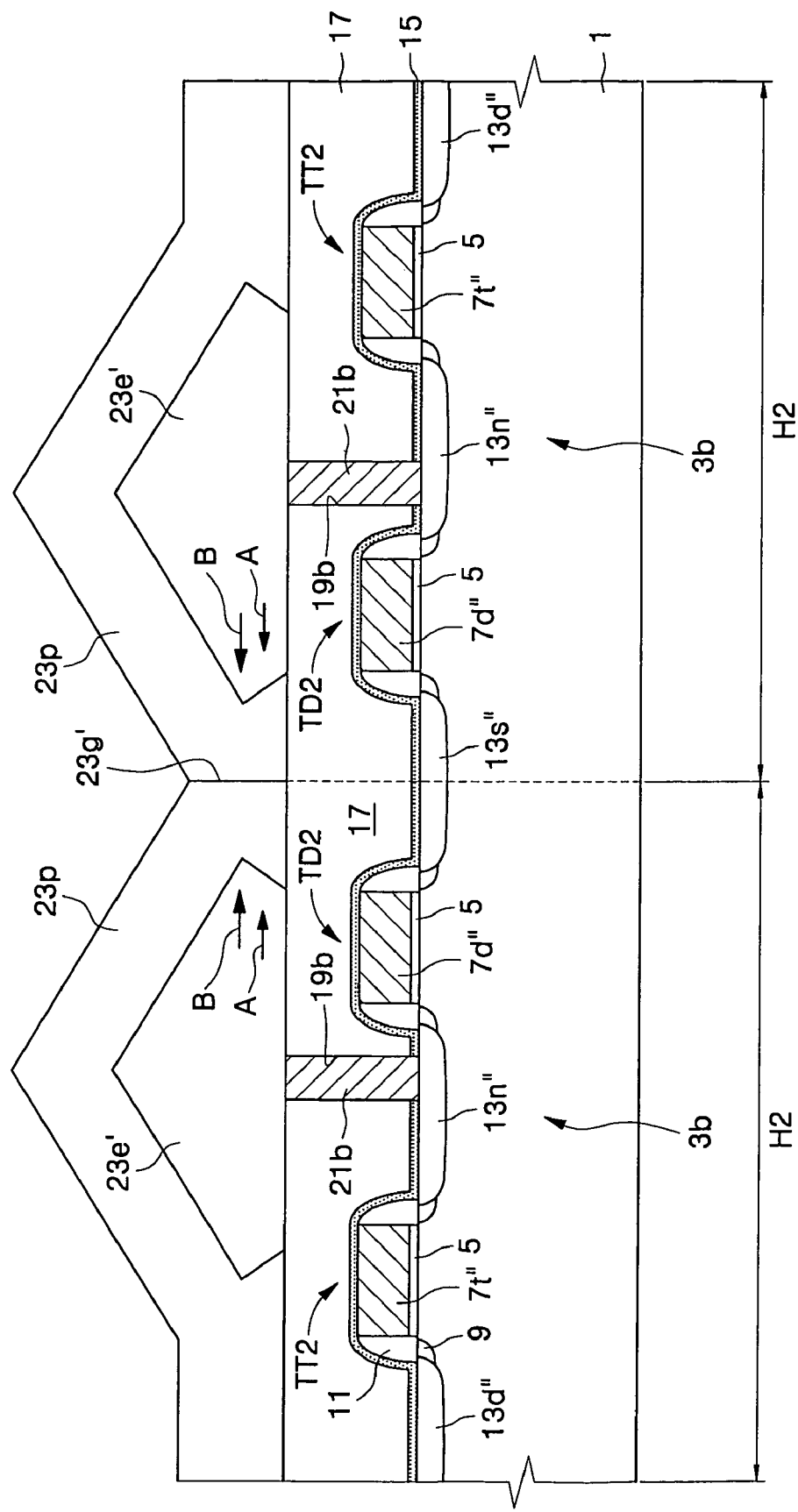

METHODS OF FABRICATING SEMICONDUCTOR INTEGRATED CIRCUITS USING SELECTIVE EPITAXIAL GROWTH AND PARTIAL PLANARIZATION TECHNIQUES

CROSS-REFERENCE TO RELATED APPLICATION

This application claims the benefit of Korea application 2004-12400, filed on Feb. 24, 2004, and Korea application 2004-71886, filed on Sep. 8, 2004, the contents of which are hereby incorporated herein by reference in their entirety.

BACKGROUND OF THE INVENTION

1. Field of the Invention

The invention relates to methods of fabricating semiconductor integrated circuit devices and semiconductor integrated circuit devices fabricated thereby and, more particularly, to methods of fabricating semiconductor integrated circuit devices with thin film transistors using a selective epitaxial growth (SEG) technique and a partial planarization technique, and semiconductor integrated circuit devices fabricated thereby.

2. Description of the Related Art

Semiconductor integrated circuits employ discrete devices, such as metal oxide semiconductor (MOS) transistors, as switching devices. Most of the MOS transistors are directly formed in a semiconductor substrate. That is, the MOS transistors are formed to have channel regions and source/drain regions in the semiconductor substrate. In this case, the MOS transistors may be referred to as bulk MOS transistors.

When the semiconductor integrated circuits employ bulk MOS transistors, there is a limitation in improving integration density of the semiconductor integrated circuits. In particular, when the semiconductor integrated circuits are complementary MOS (CMOS) circuits composed of N-channel bulk MOS transistors and P-channel bulk MOS transistors, it is more difficult to improve the integration density of the semiconductor integrated circuits due to a latch-up phenomenon that occurs in the CMOS circuit.

In recent years, in order to solve the issues of the latch-up phenomenon as well as the integration density of the semiconductor integrated circuits, thin film transistors stacked on the semiconductor substrate are widely used. For example, the thin film transistors are used in a unit cell of a static random access memory (SRAM). The SRAM may offer advantages of lower power consumption and faster operating speed as compared to a dynamic RAM (DRAM). Accordingly, the SRAM is widely used in portable appliances or as a cache memory device of a computer.

A unit cell of the SRAM is typically categorized as either a resistor-load SRAM cell or a complementary metal oxide semiconductor (CMOS) SRAM cell. The resistor-load SRAM cell employs a high resistor as the load device, and the CMOS SRAM cell employs a p-channel MOS transistor as the load device. The CMOS SRAM cell is also classified into two types: a thin film transistor (TFT) SRAM cell that employs the TFT as the load device, and a bulk CMOS SRAM cell that employs the bulk MOS transistor as the load device.

The bulk CMOS SRAM cell exhibits high cell stability as compared to the TFT SRAM cell and the resistor-load SRAM cell. In other words, the bulk CMOS SRAM cell shows excellent low voltage characteristics and low stand-by current. This is because all of the transistors constituting the bulk CMOS SRAM cell are formed at a single-crystalline silicon substrate whereas the TFTs of the TFT SRAM cell are typically formed using a polysilicon layer as a body layer. However, the bulk CMOS SRAM cell shows low integration density as well as weak latch-up immunity as compared to the TFT SRAM cell. Accordingly, in order to realize a highly integrated SRAM having high reliability, it is required to continuously improve the characteristic of the load transistors employed in the TFT SRAM cell.

In the meantime, semiconductor devices having the TFTs stacked over a semiconductor substrate are disclosed in U.S. Pat. No. 6,022,766 to Chen et al., entitled "Semiconductor Structure Incorporating Thin Film Transistors and Methods for its Manufacture". According to Chen et al., a conventional bulk MOS transistor is formed at a single-crystalline silicon substrate, and a TFT is stacked over the bulk MOS transistor. One of the source/drain regions of the bulk MOS transistor is electrically coupled to one of the source/drain regions of the TFT through a metal plug such as a tungsten plug. Therefore, when the bulk MOS transistor and the TFT are an NMOS transistor and a PMOS transistor, respectively, the bulk MOS transistor has an ohmic contact with the TFT through the metal plug.

Furthermore, a body layer of the TFT is formed by depositing an amorphous silicon layer on the semiconductor substrate having the metal plug and by crystallizing the amorphous silicon layer through an annealing process. In this case, the body layer corresponds to a polysilicon layer having large grains. That is, it is difficult to transform the body layer to a perfect single-crystalline silicon layer. In conclusion, it is difficult to form the TFT having excellent electrical characteristics that correspond to that of the bulk MOS transistor. Thus, methods for improving the characteristics of the TFT stacked over the semiconductor substrate are continuously required.

SUMMARY OF THE INVENTION

In one aspect, the invention is directed to methods of fabricating a semiconductor integrated circuit using an SEG technique and a planarization technique. The methods include forming an inter-layer insulating layer on a single-crystalline semiconductor substrate. A single-crystalline semiconductor plug penetrating the inter-layer insulating layer and a single-crystalline epitaxial semiconductor pattern covering the inter-layer insulating layer are then formed. The single-crystalline epitaxial semiconductor pattern is in contact with the single-crystalline semiconductor plug. The single-crystalline epitaxial semiconductor pattern is at least partially planarized to form a semiconductor body layer on the inter-layer insulating layer. The semiconductor body layer is patterned to form a semiconductor body.

In another aspect, the single-crystalline semiconductor plug and the single-crystalline epitaxial semiconductor pattern may be successively formed in-situ.

In yet another aspect, forming the single-crystalline semiconductor plug and the single-crystalline epitaxial semiconductor pattern may comprise patterning the inter-layer insulating layer to form a contact hole exposing the single-crystalline semiconductor substrate, growing a doped single-crystalline epitaxial semiconductor layer filling the contact hole using an SEG technique that employs the exposed single-crystalline semiconductor substrate as a seed layer, and forming a single-crystalline epitaxial semiconductor layer covering the doped single-crystalline epitaxial semiconductor layer and the inter-layer insulating layer using an SEG technique that employs the doped single-crystalline epitaxial semiconductor layer as a seed layer. The doped single-crystalline epitaxial semiconductor layer may be planarized, and the planarized single-crystalline epitaxial semiconductor layer may be cleaned.

In still another embodiment, at least partially planarizing the single-crystalline epitaxial semiconductor pattern may be carried out using a chemical mechanical polishing (CMP) technique.

In yet another embodiment, a non-single-crystalline semiconductor layer may be formed on the substrate having the single-crystalline epitaxial semiconductor pattern before forming the semiconductor body layer. The non-single-crystalline semiconductor layer may be crystallized using a solid phase epitaxial technique that employs the single-crystalline epitaxial semiconductor pattern as a seed layer. In this case, the semiconductor body layer may be formed by at least partially planarizing the crystallized semiconductor layer and the single-crystalline epitaxial semiconductor pattern. The non-single-crystalline semiconductor layer may be formed of an amorphous semiconductor layer or a polycrystalline semiconductor layer.

In yet still another embodiment, a non-single-crystalline semiconductor layer may be formed on the substrate having the single-crystalline epitaxial semiconductor pattern before forming the semiconductor body layer, and a solid phase epitaxial process may be carried out using the single-crystalline epitaxial semiconductor pattern as a seed layer before patterning the semiconductor body layer. In this case, the semiconductor body layer may be formed by at least partially planarizing the non-single-crystalline semiconductor layer and the single-crystalline epitaxial semiconductor pattern, and the planarized non-single-crystalline semiconductor layer may be crystallized during the solid phase epitaxial process.

In one embodiment, a TFT may be formed at the semiconductor body. Forming the TFT may comprise forming a gate electrode extending across the semiconductor body and covering both sidewalls of the semiconductor body, and implanting impurity ions into the semiconductor body, using the gate electrode as an ion implantation mask, to form source and drain regions.

In another embodiment, before forming the inter-layer insulating layer, an isolation layer may be formed on a predetermined region of the single-crystalline semiconductor substrate to define an active region and a bulk MOS transistor may be formed at the active region. The bulk MOS transistor may be formed to have a gate electrode extending across the active region and source/drain regions located at both sides of a channel region below the gate electrode, respectively. The single-crystalline semiconductor plug may be formed to be in contact with at least one of the source/drain regions of the bulk MOS transistor.

In another aspect, the invention is directed to methods of fabricating a TFT SRAM cell using a SEG technique and a partial planarization technique. The TFT SRAM cell includes a first half-cell and a second half-cell. The methods of fabricating any one of the first and second half-cells comprise forming an isolation layer on a predetermined region of a single-crystalline semiconductor substrate to define an active region. A driver transistor is formed at the active region. The driver transistor includes a driver gate electrode extending across the active region as well as source/drain regions located at both sides of a channel region below the driver gate electrode, respectively. An inter-layer insulating layer is formed on the substrate having the driver transistor. A single-crystalline semiconductor plug penetrating the inter-layer insulating layer and a single-crystalline epitaxial semiconductor pattern covering the inter-layer insulating layer are then formed. The single-crystalline semiconductor plug is formed to be in contact with the drain region of the driver transistor, and the single-crystalline epitaxial semiconductor pattern is formed to be in contact with the single-crystalline semiconductor plug. The single-crystalline epitaxial semiconductor pattern is at least partially planarized to form a semiconductor body layer on the inter-layer insulating layer. The semiconductor body layer is patterned to form a semiconductor body.

In still another aspect, the invention is directed to integrated circuits having a uniform single-crystalline semiconductor body. The integrated circuits comprise an inter-layer insulating layer stacked on a single-crystalline semiconductor substrate. A single-crystalline semiconductor plug is provided to penetrate the inter-layer insulating layer. A single-crystalline semiconductor body is disposed on the inter-layer insulating layer. The single-crystalline semiconductor body includes a single-crystalline epitaxial semiconductor pattern grown using the single-crystalline semiconductor plug as a seed layer and a semiconductor layer crystallized using a solid phase epitaxial technique that employs the single-crystalline epitaxial semiconductor pattern as a seed layer.

In some embodiments, the single-crystalline semiconductor plug may be an epitaxial layer formed using a SEG technique that employs the single-crystalline semiconductor substrate as a seed layer.

In other embodiments, the crystallized semiconductor layer may be a single-crystalline semiconductor layer formed by crystallizing an amorphous semiconductor layer or a polycrystalline semiconductor layer.

In still another embodiment, a TFT may be provided at the single-crystalline semiconductor body. The TFT may have source/drain regions formed in the single-crystalline semiconductor body and a gate electrode extending across a channel region between the source/drain regions and covering both sidewalls of the single-crystalline semiconductor body.

In yet another embodiment, an isolation layer may be provided on a predetermined region of the single-crystalline semiconductor substrate to define an active region, and a bulk MOS transistor may be provided at the active region. The bulk MOS transistor may have source/drain regions formed in the active region and a gate electrode extending across a channel region between the source/drain regions. The single-crystalline semiconductor plug may be electrically coupled to any one of the source/drain regions of the bulk MOS transistor.

In yet another aspect, the invention is directed to TFT SRAM cells. Each of the TFT SRAM cells includes a first half-cell and a second half-cell. Each of the first and second half-cells comprises an isolation layer formed on a predetermined region of a single-crystalline semiconductor substrate to define an active region. A driver transistor is provided at the active region. The driver transistor has source/drain regions formed in the active region and a driver gate electrode extending across a channel region between the source/drain regions. An inter-layer insulating layer is provided on the substrate having the driver transistor. The drain region of the driver transistor is in contact with a single-crystalline semiconductor plug that penetrates the inter-layer insulating layer. A single-crystalline semiconductor body is disposed on the inter-layer insulating layer. The single-crystalline semiconductor body extends to be in contact with the single-crystalline semiconductor plug. The single-crystalline semiconductor body includes a single-crystalline epitaxial semiconductor pattern grown using the single-crystalline semiconductor plug as a seed layer and a semiconductor layer crystallized using a solid phase epitaxial technique that employs the single-crystalline epitaxial semiconductor pattern as a seed layer.

BRIEF DESCRIPTION OF THE DRAWINGS

The foregoing and other features and advantages of the embodiments of the invention will become readily apparent by reference to the following detailed description when considered in conjunction with the accompanying drawings.

FIGS. 9B, 10B and 11B are cross-sectional views taken along line II-II' of FIG. 2 to illustrate methods of fabricating CMOS SRAM cells employing TFTs in accordance with other embodiments of the invention.

DETAILED DESCRIPTION OF THE EMBODIMENTS

Figure 1:
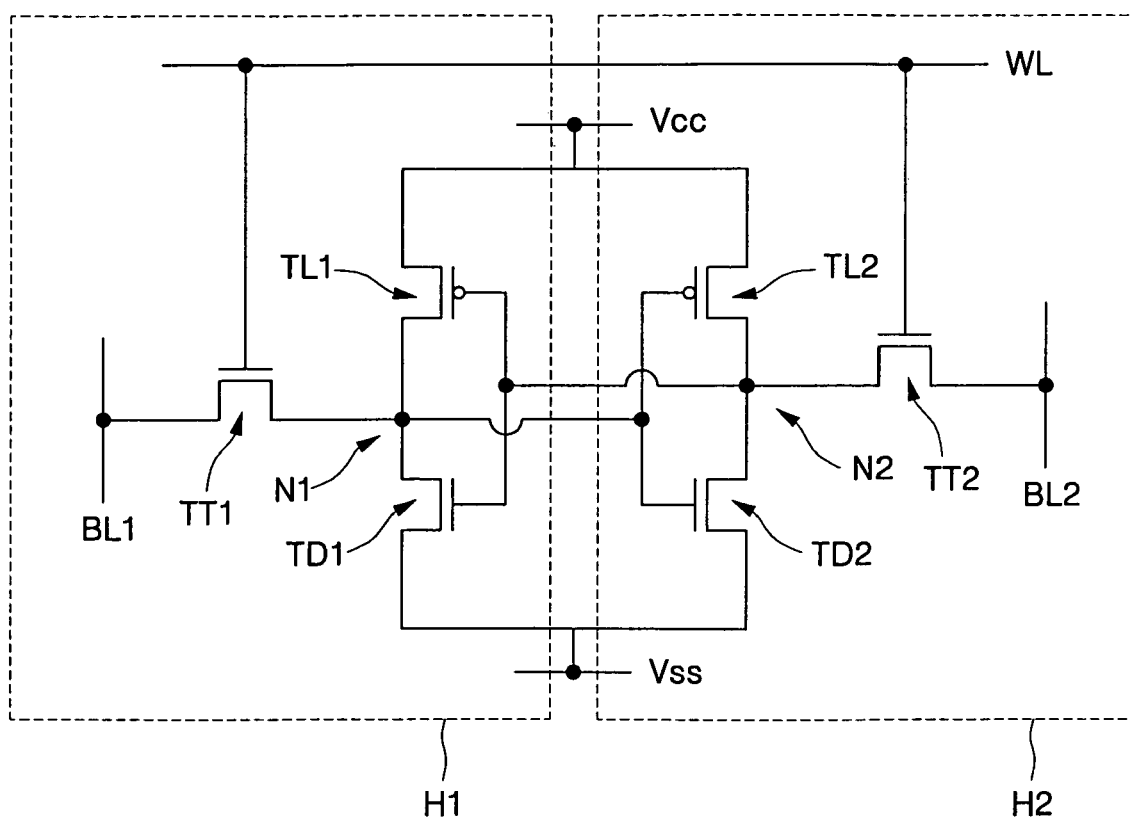
FIG. 1 is a typical circuit diagram of a CMOS SRAM cell.

The invention will be described below with reference to the accompanying drawings, in which embodiments of the invention are shown. However, this invention may be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like reference numerals refer to similar or identical elements throughout. It will be understood that when an element such as a layer, a region, or a substrate is referred to as being "on" another element, it can be directly on the other element or intervening elements may also be present.

FIG. 1 is a typical circuit diagram of a CMOS SRAM cell, such as a bulk CMOS SRAM cell or a TFT SRAM cell.

Referring to FIG. 1, the CMOS SRAM cell includes a pair of driver transistors TD 1 and TD2, a pair of transfer transistors TT1 and TT2, and a pair of load transistors TL1 and TL2. The driver transistors TD1 and TD2 and the transfer transistors TT1 and TT2 are n-channel metal oxide semiconductor (NMOS) transistors, while the load transistors TL1 and TL2 are p-channel metal oxide semiconductor (PMOS) transistors. The first driver transistor TD1, the first transfer transistor TT1 and the first load transistor TL1 constitute a first half-cell H1, and the second driver transistor TD2, the second transfer transistor TT2 and the second load transistor TL2 constitute a second half-cell H2.

The first driver transistor TD1 and the first transfer transistor TT1 are serially connected to each other. A source region of the first driver transistor TD1 is electrically coupled to a ground line $V_{ss}$, and a drain region of the first transfer transistor TT1 is electrically coupled to a first bit line BL1. Similarly, the second driver transistor TD2 and the second transfer transistor TT2 are serially connected to each other. A source region of the second driver transistor TD2 is electrically coupled to the ground line Vss, and a drain region of the second transfer transistor TT2 is electrically coupled to a second bit line BL2.

Source and drain regions of the first load transistor TL1 are electrically coupled to a power supply line Vcc and a drain region of the first driver transistor TD1, respectively. Similarly, source and drain regions of the second load transistor TL2 are electrically coupled to the power supply line Vcc and a drain region of the second driver transistor TD2, respectively. The drain region of the first load transistor TL1, the drain region of the first driver transistor TD1, and the source region of the first transfer transistor TT1 correspond to a first node N1. Further, the drain region of the second load transistor TL2, the drain region of the second driver transistor TD2, and the source region of the second transfer transistor TT2 correspond to a second node N2. A gate electrode of the first driver transistor TD1 and a gate electrode of the first load transistor TL1 are electrically coupled to the second node N2, and a gate electrode of the second driver transistor TD2 and a gate electrode of the second load transistor TL2 are electrically coupled to the first node N1. In addition, gate electrodes of the first and second transfer transistors TT1 and TT2 are electrically coupled to a word line WL.

The CMOS SRAM cell described above may exhibit a relatively large noise margin as well as a relatively small stand-by current as compared to a resistor-load SRAM cell. Accordingly, the CMOS SRAM cell is widely employed in a high performance SRAM that requires a low power voltage. In particular, when the TFT SRAM cell includes high performance P-channel TFTs having enhanced electrical characteristics that correspond to those of P-channel bulk transistors used as load transistors of the bulk CMOS SRAM cell, the TFT SRAM cell may have advantages in terms of integration density and latch-up immunity as compared to the bulk CMOS SRAM cell.

In order to realize the high performance P-channel TFT, the TFT should be formed at a body pattern composed of a single-crystalline semiconductor layer. In addition, ohmic contacts should be provided at the first and second nodes N1 and N2 shown in FIG. 1.

Figure 2:
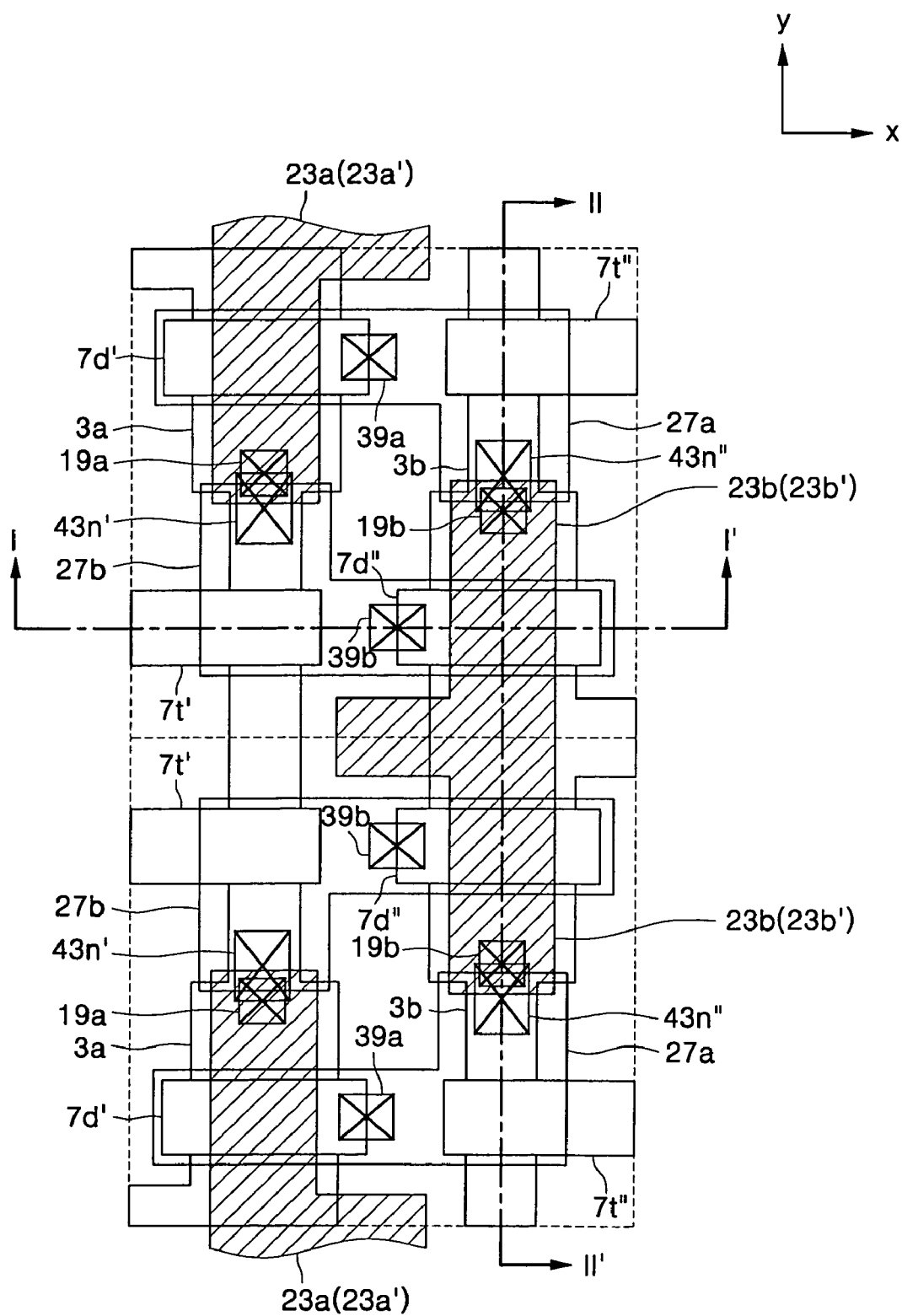
FIG. 2 is a plan view of CMOS SRAM cells employing TFTs fabricated in accordance with embodiments of the invention.

FIG. 2 is a plan view illustrating a pair of TFT SRAM cells in accordance with embodiments of the invention. The pair of TFT SRAM cells shown in FIG. 2 is symmetrical with respect to the x-axis. The pair of TFT SRAM cells is repeatedly arrayed to be symmetrical with respect to the x-axis and y-axis to constitute a cell array region. Each of the TFT SRAM cells shown in FIG. 2 is a layout of a CMOS SRAM cell that corresponds to the circuit of FIG. 1. In addition, FIGS. 3A, 4A, 5A, 6A and 7A are cross-sectional views taken along line I-I' of FIG. 2 in order to illustrate TFT SRAM cells according to embodiments of the invention and methods of fabricating the TFT SRAM cells, and FIGS. 3B, 4B, 5B, 6B and 7B are cross-sectional views taken along line II-II' of FIG. 2 in order to illustrate TFT SRAM cells according to embodiments of the invention and methods of fabricating the TFT SRAM cells. That is, FIGS. 3A, 4A, 5A, 6A and 7A are cross-sectional views which show the first half-cell region H1 and the second half-cell region H2 adjacent to each other in cross section, and FIGS. 3B, 4B, 5B, 6B and 7B are cross-sectional views which show a pair of second half-cell regions H2 adjacent to each other in cross section.

Referring to FIGS. 1, 2, 3A and 3B, an isolation layer 3 is formed on a predetermined region of a single-crystalline semiconductor substrate 1, such as a single-crystalline silicon substrate, to define first and second active regions 3a and 3b in the first and second half-cell regions H1 and H2, respectively. Each of the first and second active regions 3a and 3b may include a transfer transistor active region 3t and a driver transistor active region 3d. A gate insulating layer 5 is formed on the active regions 3a and 3b, and a gate conductive layer is formed on the substrate having the gate insulating layer 5. The gate conductive layer is patterned to form a first driver gate electrode 7d' (FIG. 2) and a first transfer gate electrode 7t' extending across the first active region 3a, as well as a second driver gate electrode 7d" and a second transfer gate electrode 7t" extending across the second active region 3b.

The first transfer gate electrode 7t' and the first driver gate electrode 7d' are formed to extend across the transfer transistor active region 3t and the driver transistor active region 3d in the first active region 3a, respectively; and the second transfer gate electrode 7t" and the second driver gate electrode 7d" are formed to extend across the transfer transistor active region 3t and the driver transistor active region 3d in the second active region 3b, respectively.

Impurity ions of a first conductivity type are implanted into the active regions 3a and 3b, using the transfer gate electrodes 7t' and 7t" and the driver gate electrodes 7d' and 7d" as ion implantation masks, to form lightly doped drain (LDD) regions 9. The impurity ions of the first conductivity type may be N-type impurity ions. Gate spacers 11 are formed on sidewalls of the transfer gate electrodes 7t' and 7t" and the driver gate electrodes 7d' and 7d". Impurity ions of the first conductivity type are implanted into the active regions 3a and 3b using the gate electrodes 7t', 7t", 7d' and 7d" and the gate spacers 11 as ion implantation masks. As a result, a first node impurity region (not shown) is formed at the first active region 3a between the first driver gate electrode 7d' and the first transfer gate electrode 7t', a first bit line impurity region (not shown) is formed at the first active region 3a adjacent to the first transfer gate electrode 7t' and opposite to the first node impurity region, and a first ground impurity region (not shown) is formed at the first active region 3a adjacent to the first driver gate electrode 7d' and opposite to the first node impurity region. Similarly, a second node impurity region 13n'" is formed at the second active region 3b between the second driver gate electrode 7d" and the second transfer gate electrode 7t", a second bit line impurity region 13d'" is formed at the second active region 3b adjacent to the second transfer gate electrode 7t" and opposite to the second node impurity region 13n'", and a second ground impurity region 13s'" is formed at the second active region 3b adjacent to the second driver gate electrode 7d" and opposite to the second node impurity region 13n'". In this case, the LDD regions 9 remain below the gate spacers 11. The impurity regions 13s'", 13n'" and 13d'" are formed to have higher concentrations than the LDD regions 9. That is, LDD type source/drain regions are formed at the active regions 3a and 3b. As a result, a first transfer transistor TT1 and a first driver transistor TD1, which are serially connected to each other, are formed at the first active region 3a, and a second transfer transistor TT2 and a second driver transistor TD2, which are serially connected to each other, are formed at the second active region 3b.

An inter-layer insulating layer 17 is formed on the semiconductor substrate 1 having the impurity regions 13s'", 13n'" and 13d'". The inter-layer insulating layer 17 may be formed of a dielectric material such as silicon oxide. A conformal etch stop layer 15 may be formed before forming the inter-layer insulating layer 17. The etch stop layer 15 is preferably formed of an insulating layer having an etch selectivity with respect to the inter-layer insulating layer 17. For example, the etch stop layer 15 may be formed of silicon nitride.

Referring to FIGS. 1, 2, 4A and 4B, the inter-layer insulating layer 17 and the etch stop layer 15 are patterned to form first and second node contact holes 19a and 19b that expose the first node impurity region and the second node impurity region 13n'", respectively. A first node semiconductor plug (not shown) and a second node semiconductor plug 21b are formed in the first and second node contact holes 19a and 19b, respectively. The node semiconductor plugs, e.g., 21b, may be formed using an SEG technique that employs the exposed node impurity regions, e.g., 13n'", as seed layers. In this case, the node semiconductor plugs, e.g., 21b, are formed to have substantially the same crystalline structure as the exposed node impurity regions, e.g., 13n'". For example, when the semiconductor substrate 1 is a single-crystalline silicon substrate and the SEG technique is carried out using a silicon source gas, the node semiconductor plugs, e.g., 21b, are formed to have a single-crystalline silicon structure. That is, the node semiconductor plugs, e.g., 21b, may be single-crystalline semiconductor plugs. The node semiconductor plugs, e.g., 21b, may be doped with P-type impurities or N-type impurities. When the doped node semiconductor plugs, e.g., 21b, are overgrown to be higher than a top surface of the inter-layer insulating layer 17, the node semiconductor plugs, e.g., 21b, may be planarized using a chemical mechanical polishing (CMP) process, thereby having the same height as the inter-layer insulating layer 17.

Surfaces of the planarized node semiconductor plugs, e.g., 21b, may be cleaned. The cleaning process may be performed to remove contamination layers formed on the surfaces of the planarized node semiconductor plugs, e.g., 21b. In this case, the cleaning process may be performed using a dry etch gas or a wet chemical solution for etching the node semiconductor plugs, e.g., 21b.

Single-crystalline epitaxial semiconductor patterns 23e' are formed using an SEG technique that employs the node semiconductor plugs, e.g., 21b, as seed layers. As a result, the single-crystalline epitaxial semiconductor patterns 23e' are preferably grown upwardly and laterally to cover the inter-layer insulating layer 17. When the node semiconductor plugs 21b are single-crystalline silicon plugs, the single-crystalline epitaxial semiconductor patterns 23e' may be grown using a silicon source gas. That is, the single-crystalline epitaxial semiconductor patterns 23e' may be single-crystalline silicon patterns.

While the single-crystalline epitaxial semiconductor patterns 23e' are grown, a first lateral growth rate A at an interface between the inter-layer insulating layer 17 and the single-crystalline epitaxial semiconductor patterns 23e' may be lower than a second lateral growth rate B in a bulk region of the single-crystalline epitaxial semiconductor patterns 23e'. This is because the inter-layer insulating layer 17 prevents the single-crystalline epitaxial semiconductor patterns 23e' from growing. As a result, undercut regions U may be formed below edges of the single-crystalline epitaxial semiconductor patterns 23e'.

Figure 4A:
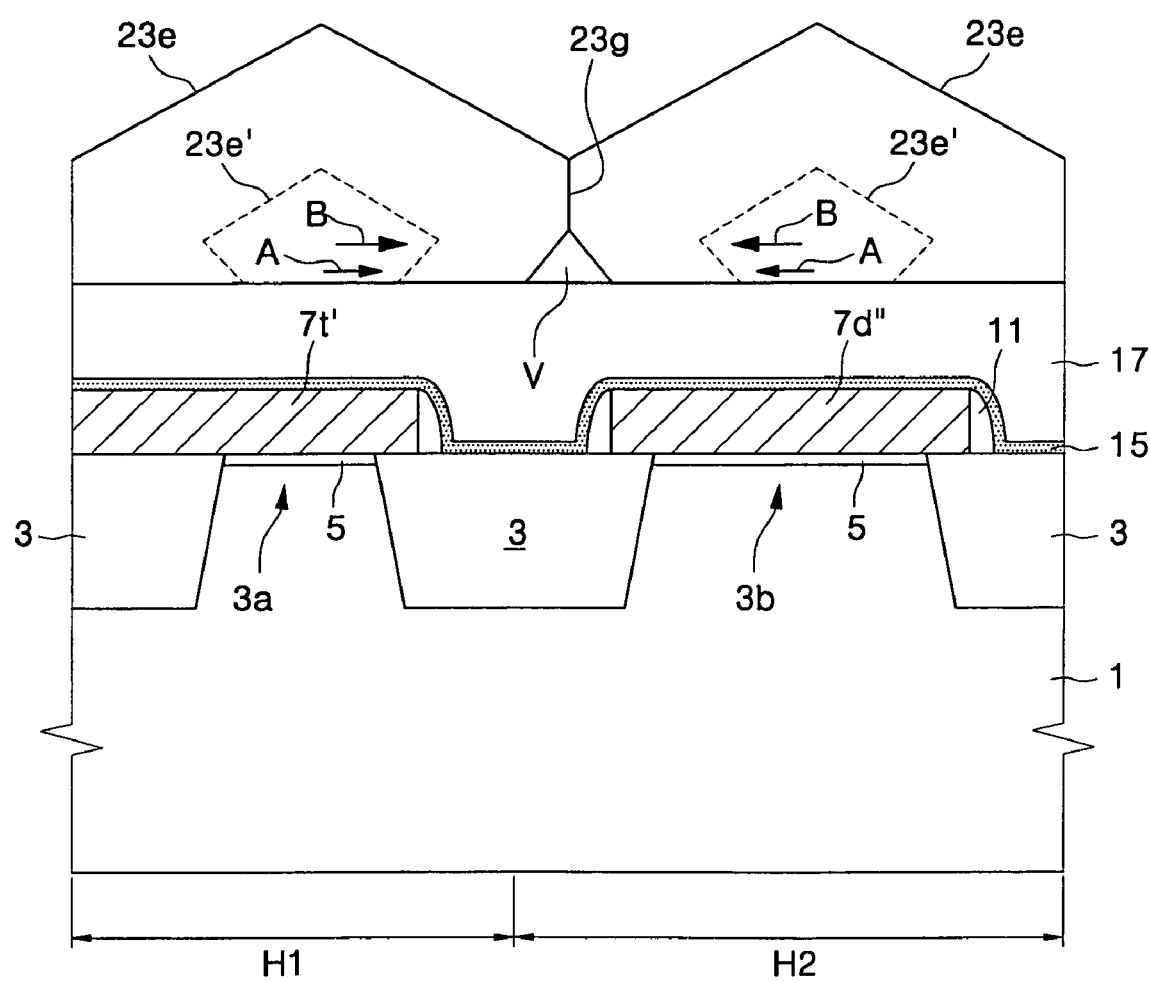
Figure 4B:
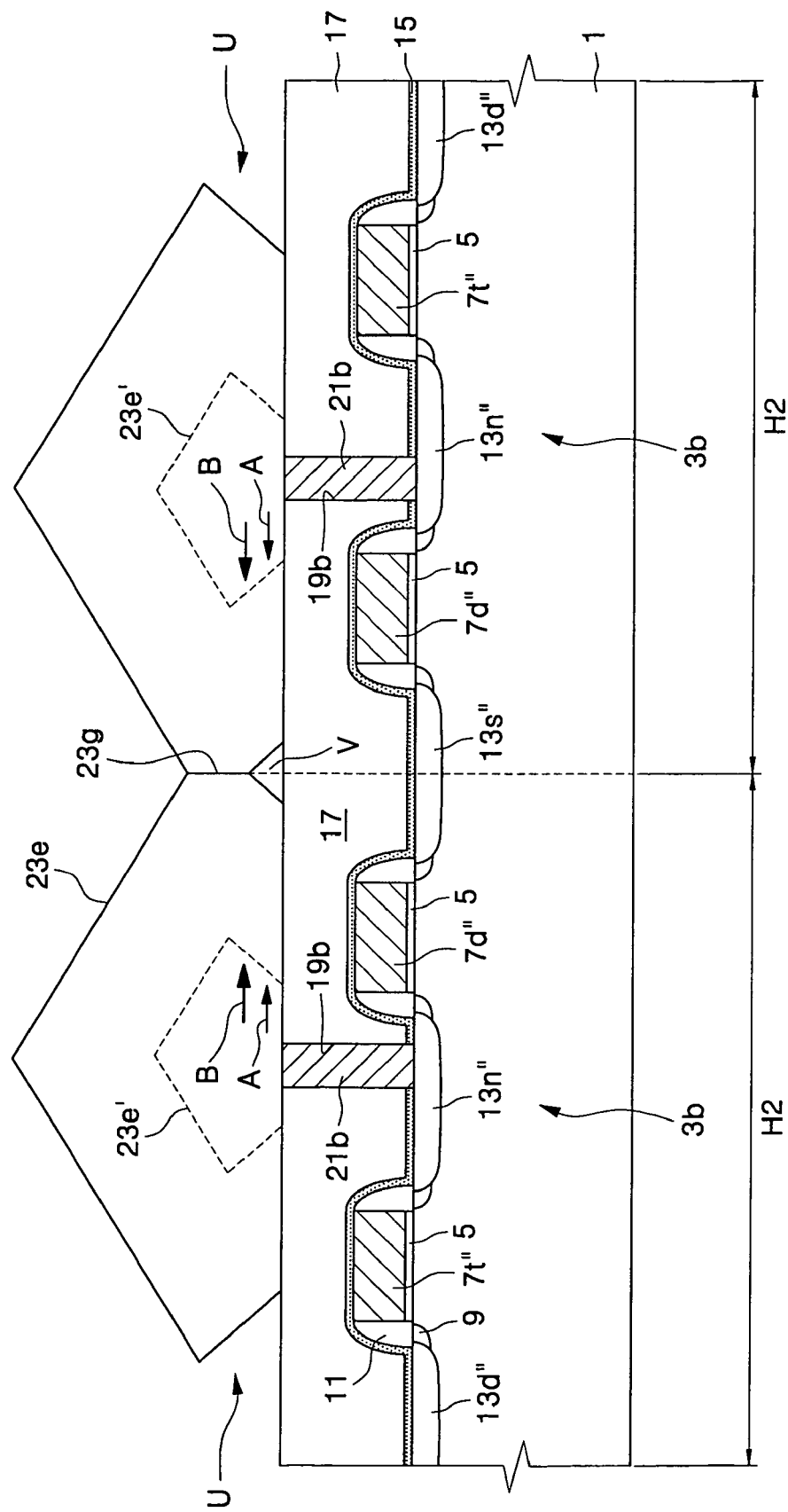

As shown in FIGS. 4A and 4B, when the node semiconductor plugs, e.g., 21b, are close to each other, the single-crystalline epitaxial semiconductor patterns 23e' may keep growing to be in contact with each other at border regions between the half-cell regions H1 and H2. As a result, single-crystalline epitaxial semiconductor layers 23e may be formed on the inter-layer insulating layer 17. In this case, the single-crystalline epitaxial semiconductor layers 23e may have voids V as well as grain boundaries 23g formed at the border regions between the half-cell regions H1 and H2. The voids V may be formed due to the difference between the first and second lateral growth rates A and B of the single-crystalline epitaxial semiconductor patterns 23e' as described above.

In other embodiments of the invention, the node semiconductor plugs 21b and the single-crystalline epitaxial semiconductor patterns 23e' may keep growing using an SEG technique that employs the exposed node impurity regions 13n'' as seed layers. That is, the node semiconductor plugs 21b and the single-crystalline epitaxial semiconductor patterns 23e' may be formed in-situ. In this case, the node semiconductor plugs and the single-crystalline epitaxial semiconductor patterns may be intrinsic semiconductors.

Referring to FIGS. 1, 2, 5A and 5B, the single-crystalline epitaxial semiconductor layer 23e is at least partially planarized to form single-crystalline semiconductor body layers 23f having a uniform thickness on the inter-layer insulating layer 17. The partial planarization process may be performed using a CMP technique. Even after the single-crystalline semiconductor body layers 23f are formed, the voids V may still remain on the border regions between the half-cell regions H1 and H2.

Referring to FIGS. 1, 2, 6A and 6B, the single-crystalline semiconductor body layers 23f are patterned to form a single-crystalline semiconductor body 23b in the second half-cell region H2. Another single-crystalline semiconductor body 23a may also be formed in the first half-cell region H1 during the formation of the single-crystalline semiconductor body 23b. The single-crystalline semiconductor body 23a in the first half-cell region H1 may be patterned to cover the first node semiconductor plug in the first node contact hole 19a, and the single-crystalline semiconductor body 23b in the second half-cell region H2 may be patterned to cover the second node semiconductor plug 21b in the second node contact hole 19b.

Referring to FIGS. 1, 2, 7A and 7B, a gate insulating layer 25 is formed on surfaces of the single-crystalline semiconductor bodies 23a and 23b. A gate conductive layer is formed on the substrate having the gate insulating layer 25, and is patterned to form gate electrodes, i.e., load gate electrodes 27b that extend across over the single-crystalline semiconductor bodies 23b. Other load gate electrodes 27a may be formed in the first half-cell regions H1 adjacent to the second half-cell regions H2 during the formation of the load gate electrodes 27b. The load gate electrodes 27a in the first half-cell regions H1 may extend to be adjacent to the node semiconductor plugs 21b in the second half-cell regions H2. Similarly, the load gate electrodes 27b in the second half-cell regions H2 may also extend to be adjacent to the node semiconductor plugs in the first half-cell regions H1.

Impurity ions are implanted into the single-crystalline semiconductor bodies 23b, using the load gate electrodes 27b as ion implantation masks, to form source regions 29s and drain regions 29d. The drain regions 29d are formed in the single-crystalline semiconductor bodies 23b on the node semiconductor plugs 21b, and the source regions 29s are formed in the single-crystalline semiconductor bodies 23b between the load gate electrodes 27b.

As a result, a pair of load thin film transistors TL2 may be formed in the second half-cell regions H2 adjacent to each other. While the load thin film transistors TL2 are formed, another load thin film transistor TL1 may also be formed in the first half-cell region H1.

Each of the load thin film transistors TL2 includes the load gate electrode 27b as well as the drain region 29d and the source region 29s that is located on both sides of the load gate electrode 27b, respectively.

Figure 7A:
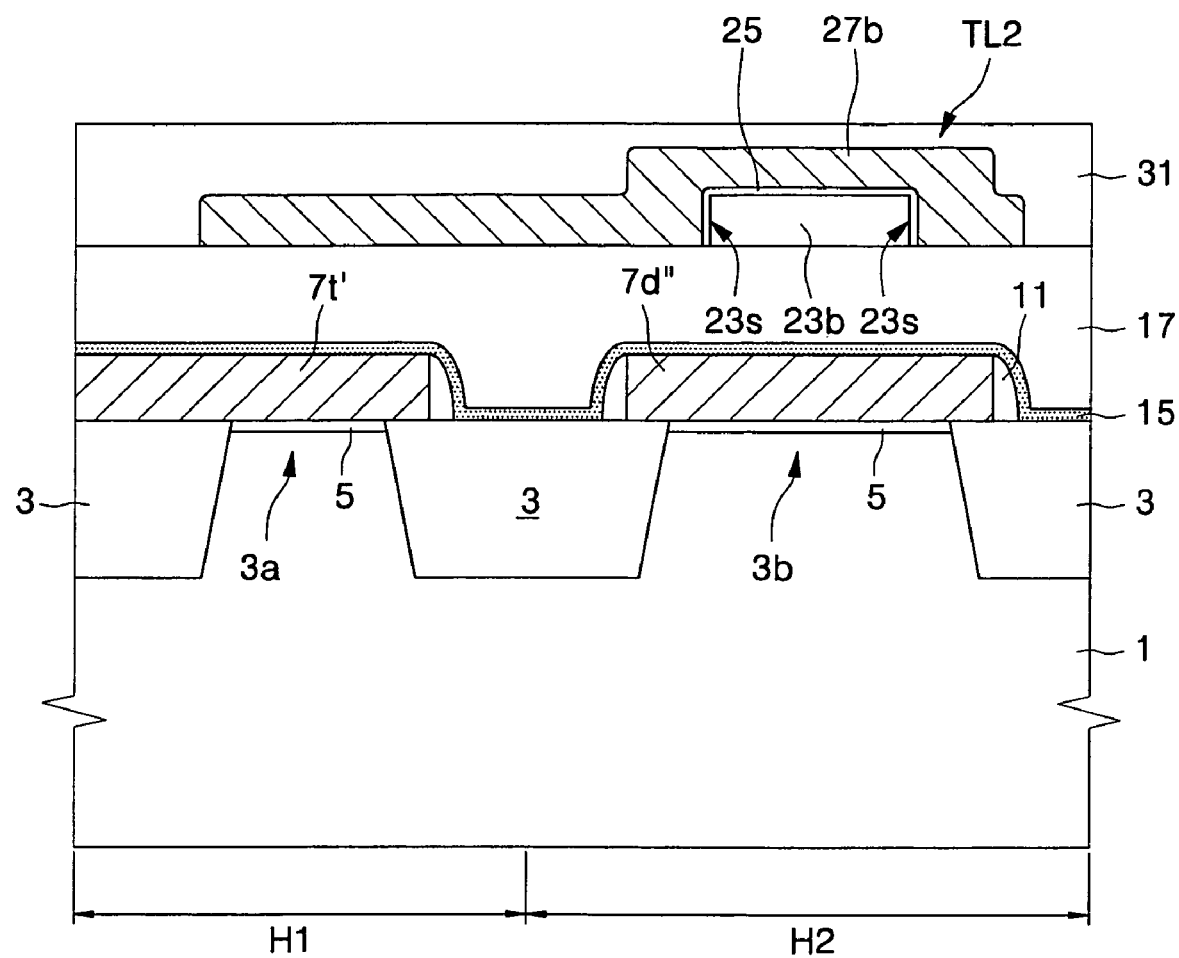
Figure 7B:
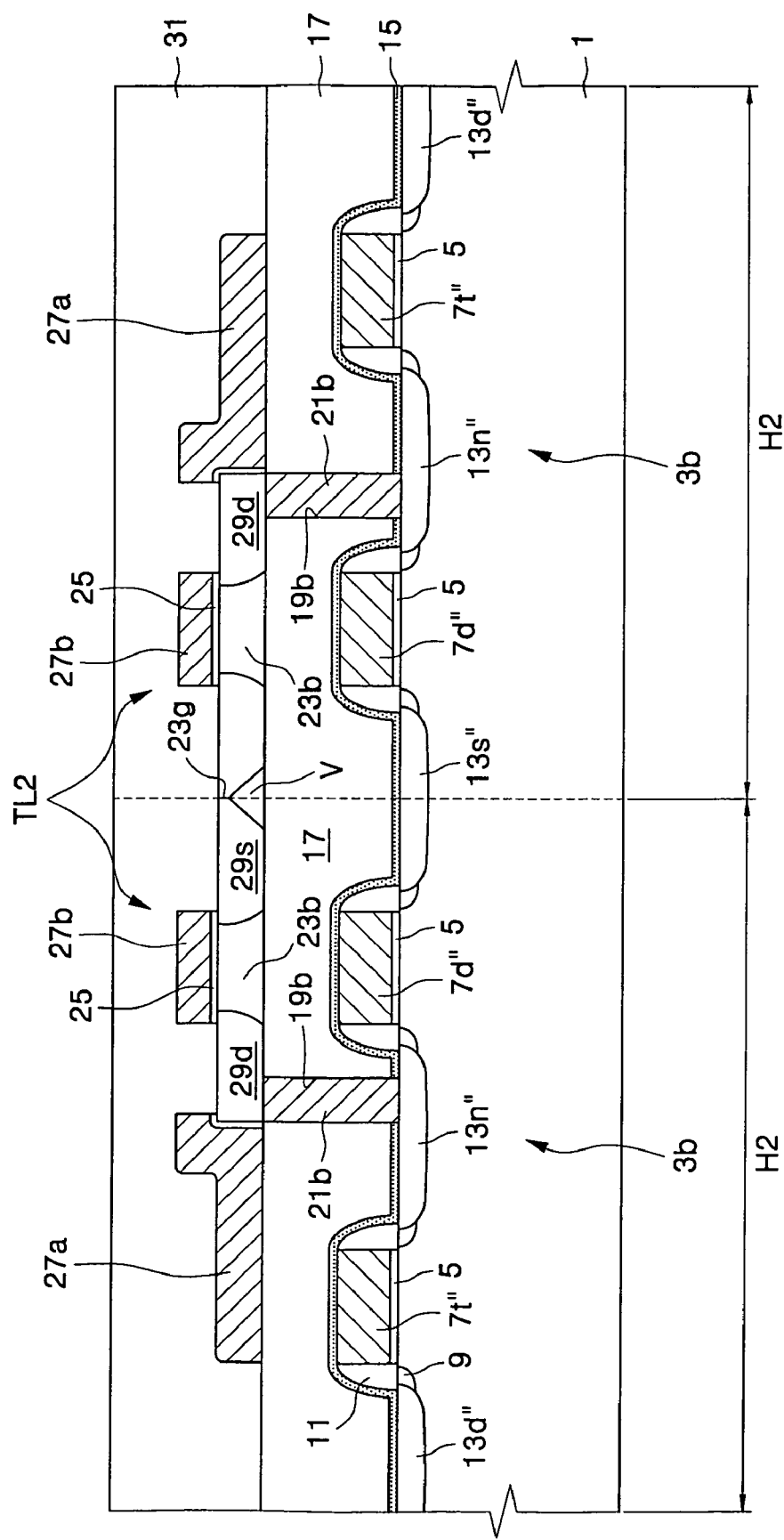
Figure 8A:
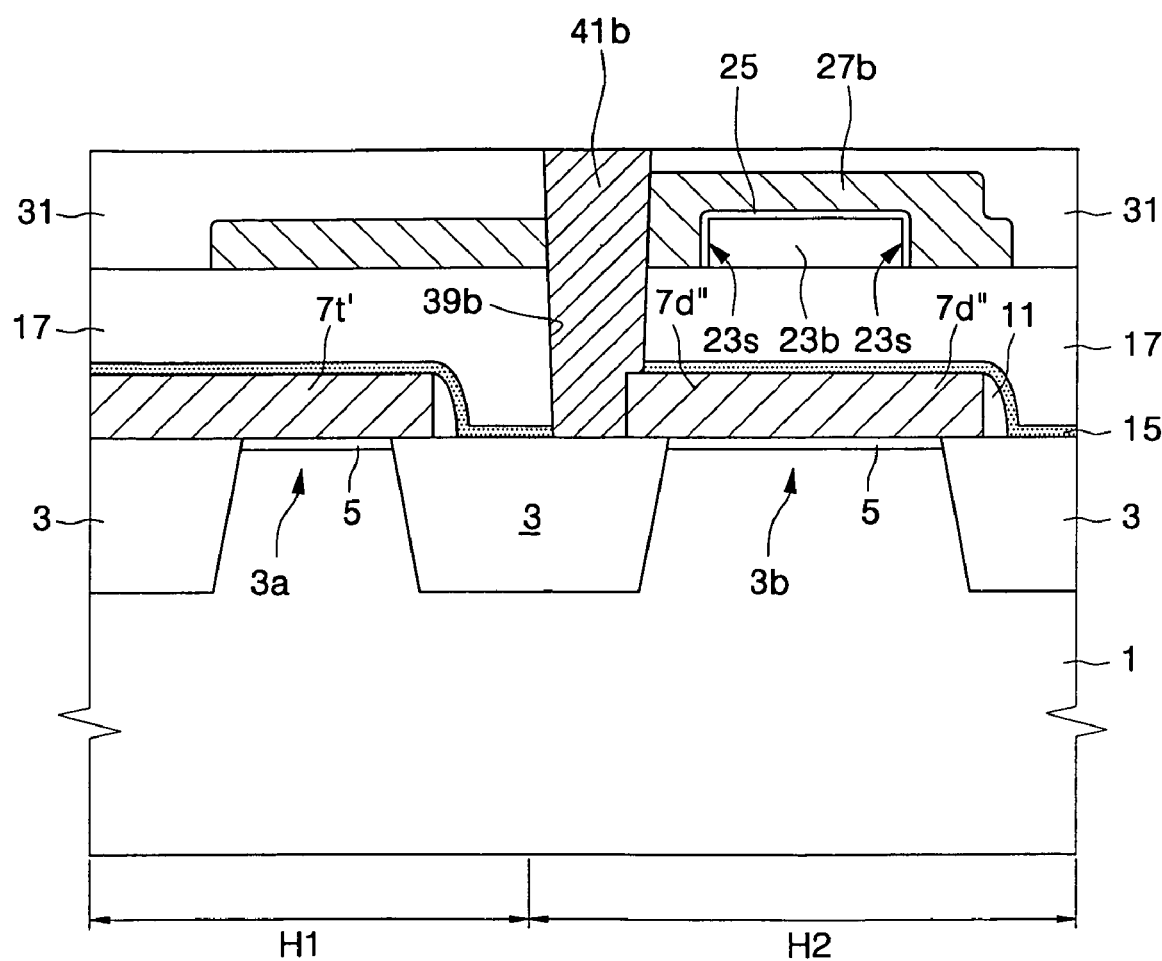
Figure 8B:
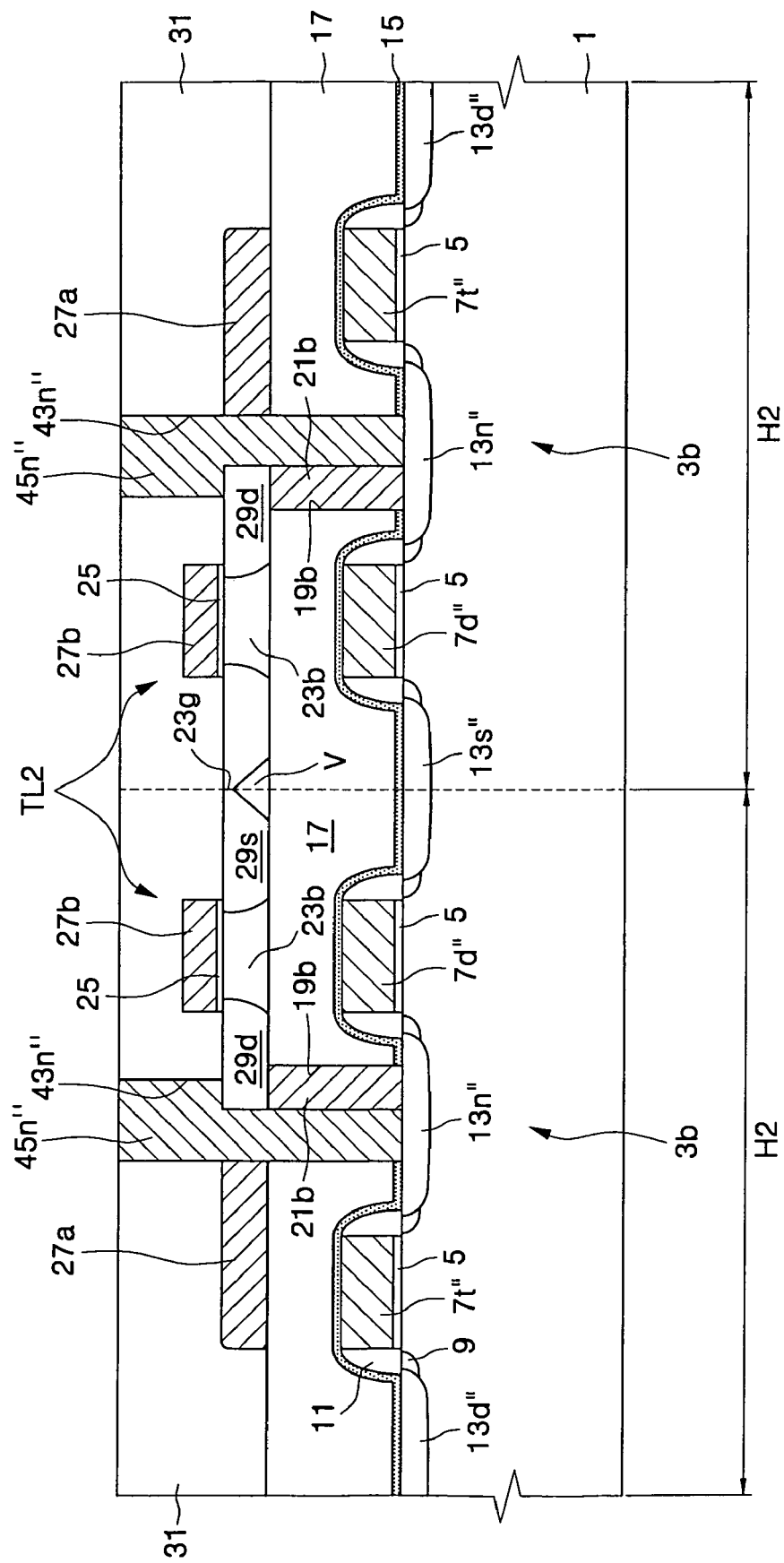

In one embodiment, the load gate electrodes 27b may be formed to cover sidewalls 23s of the single-crystalline semiconductor bodies 23b as shown in FIG. 7A. Accordingly, when a gate voltage higher than a threshold voltage is applied to the load gate electrodes 27b, channel layers may be formed not only on the upper surfaces of the single-crystalline semiconductor bodies 23b but also on the sidewalls 23s thereof.

Similarly, the load gate electrodes 27a within the first half-cell regions H1 may also be formed to cover sidewalls of the single-crystalline semiconductor bodies 23a. As a result, the load thin film transistors TL1 and TL2 according to these embodiments may have the same structure as a fin-type field effect transistor (FET).

A second inter-layer insulating layer 31 is formed on the substrate including the load thin film transistors TL1 and TL2.

Referring to FIGS. 1, 2, 8A and 8B, the second inter-layer insulating layer 31, the load gate electrodes 27a and 27b, the inter-layer insulating layer 17, and the etch stop layer 15 are sequentially etched to form first gate contact holes 39a (FIG. 2) that penetrate the load gate electrodes 27a and expose the first driver gate electrodes 7d' and to form second gate contact holes 39b (FIG. 2 and FIG. 8A) that penetrate the load gate electrodes 27b and expose the second driver gate electrodes 7d''. Metal gate plugs 41b are formed in the first and second gate contact holes 39a and 39b. The metal gate plugs 41b may be formed of a metal layer, for example, a tungsten layer, having an ohmic contact with both of the load gate electrodes 27a and 27b and the driver gate electrodes 7d' and 7d''.

Subsequently, the second inter-layer insulating layer 31, the load gate electrodes 27a and 27b, the inter-layer insulating layer 17, and the etch stop layer 15 are sequentially etched to form first drain contact holes 43n' (FIG. 2) that expose the load gate electrodes 27b, the drain regions 29d, the node semiconductor plugs and the first node impurity regions in the first half-cell regions H1, and to form second drain contact holes 43n'' (FIG. 2 and FIG. 8B) that expose the load gate electrodes 27a, the drain regions 29d, the node semiconductor plugs 21b and the second node impurity regions 13n'' in the second half-cell regions H2. Metal drain plugs 45n'' are formed in the drain contact holes 43n' and 43n''. The metal drain plugs 45n'' may be formed of a metal layer, such as a tungsten layer, having an ohmic contact with all of the load gate electrodes 27a and 27b, the drain regions 29d, the node semiconductor plugs 21b and the node impurity regions 13n''. In the alternative, the metal drain plugs 45n'' may be formed before forming the metal gate plugs 41b.

Figure 9A:
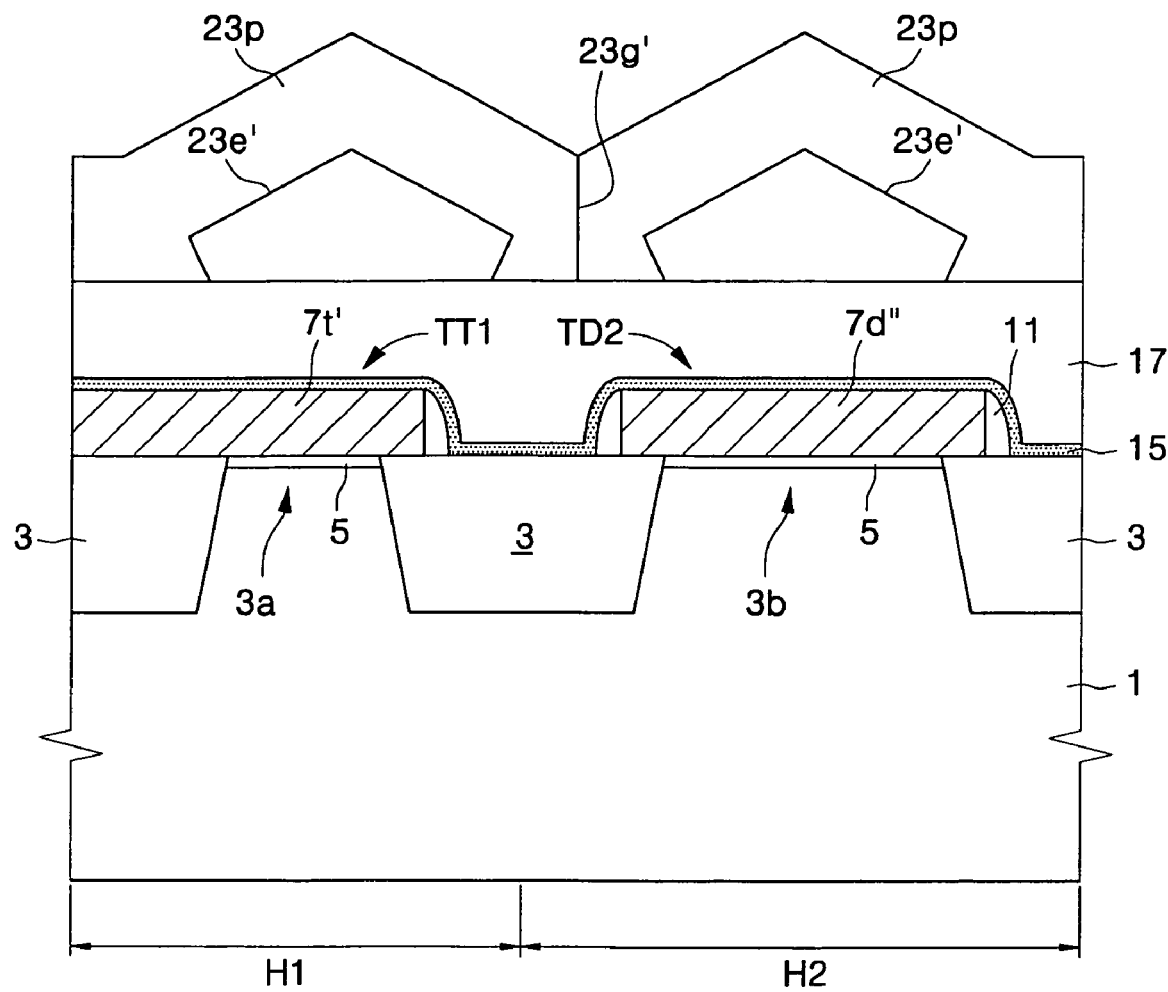
FIGS. 9A, 10A and 11A are cross-sectional views taken along line I-I' of FIG. 2 to illustrate methods of fabricating CMOS SRAM cells employing TFTs in accordance with other embodiments of the invention.
Figure 10A:
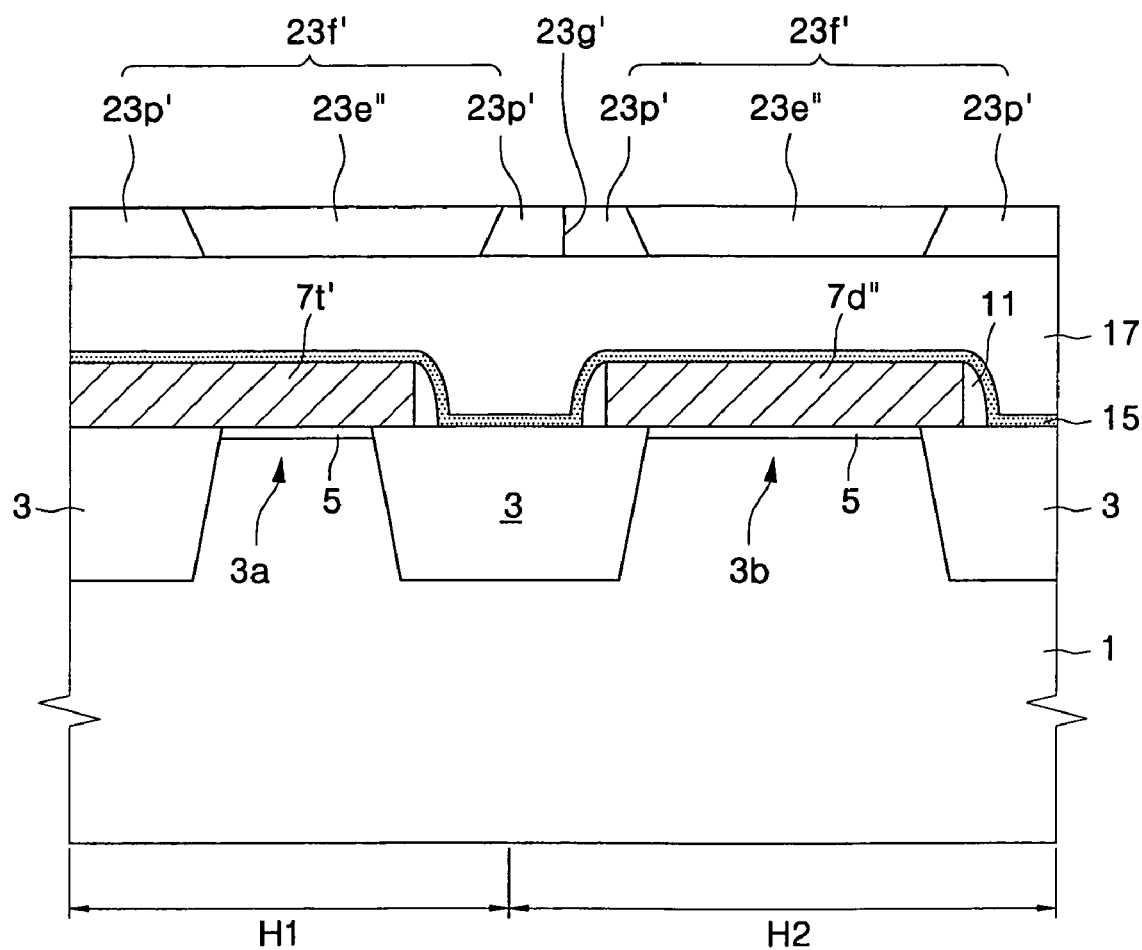
Figure 10B:
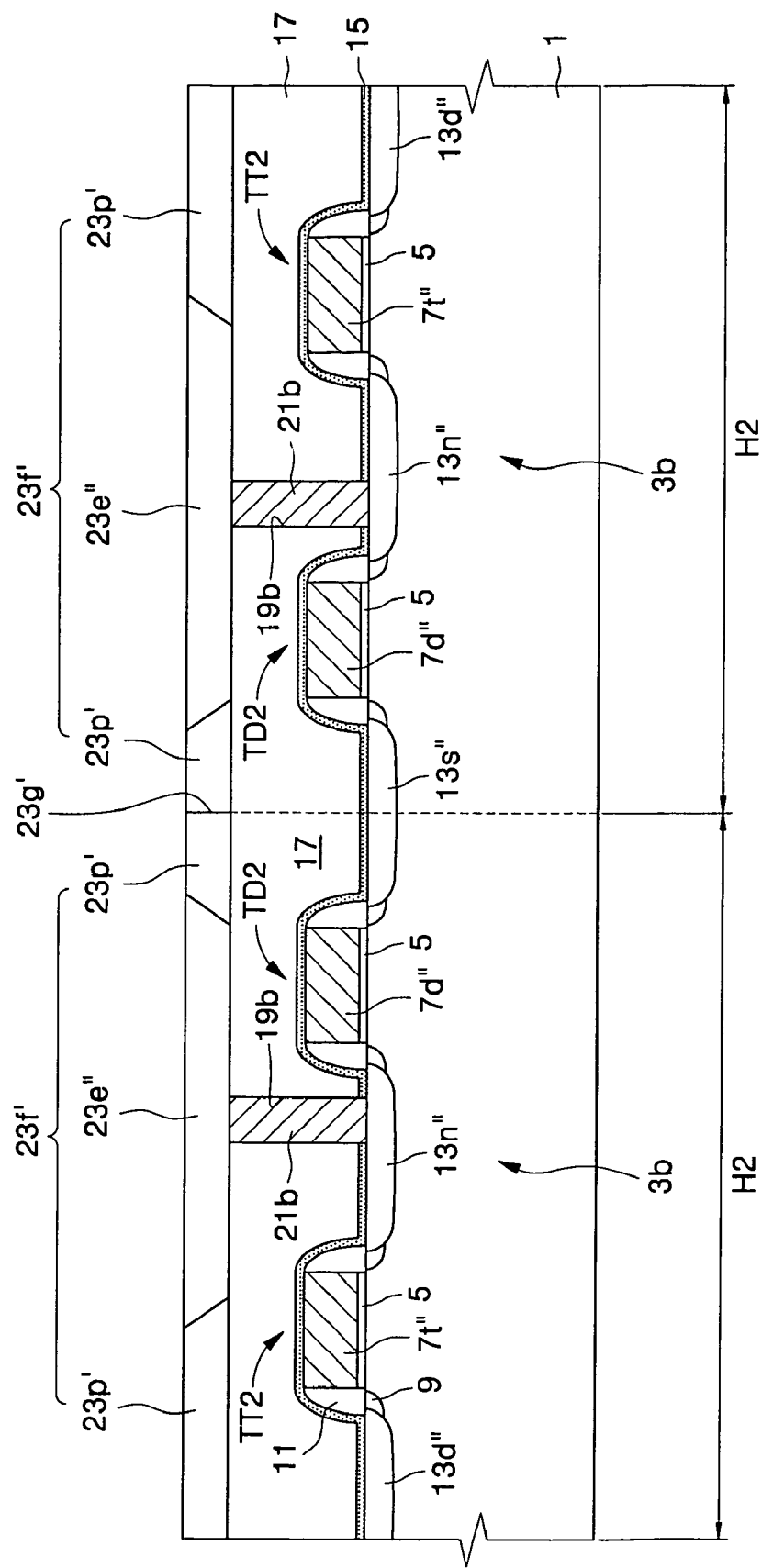
Figure 11A:
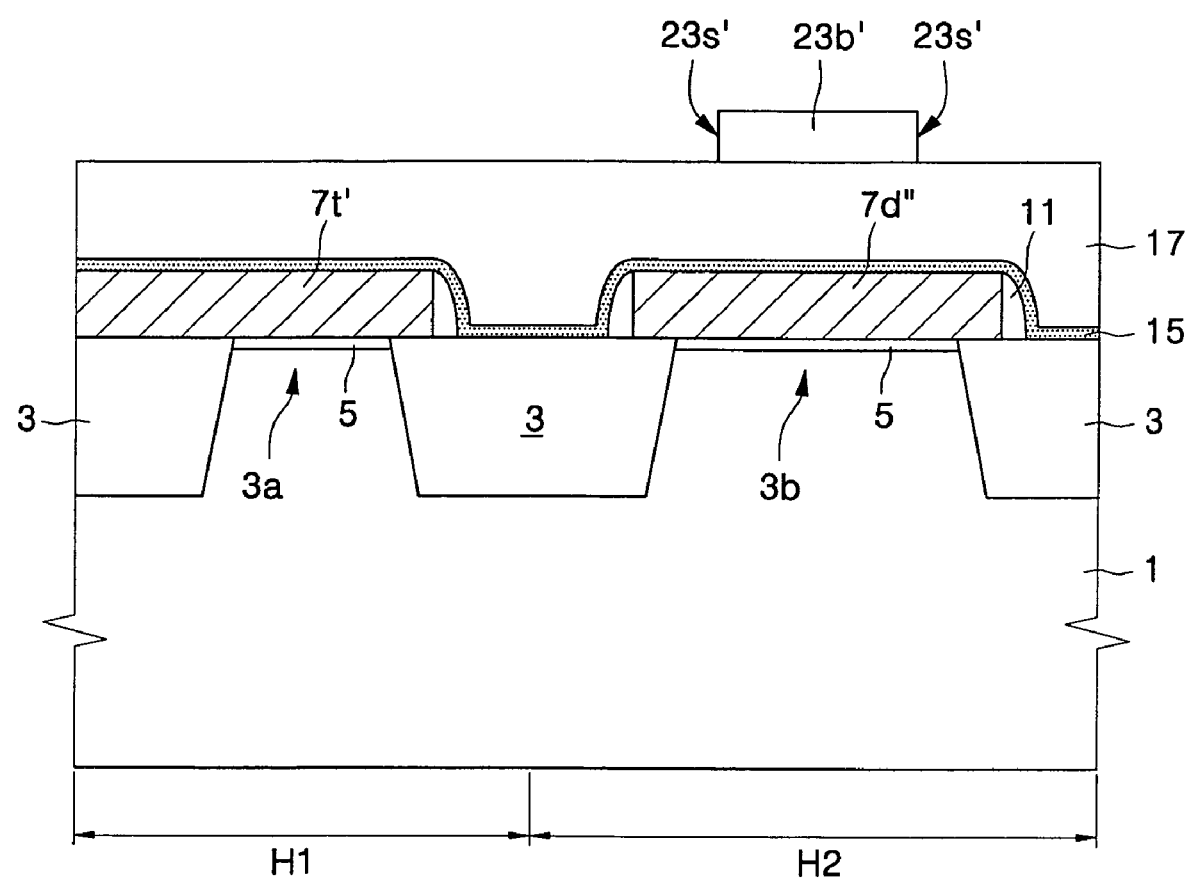
Figure 11B:
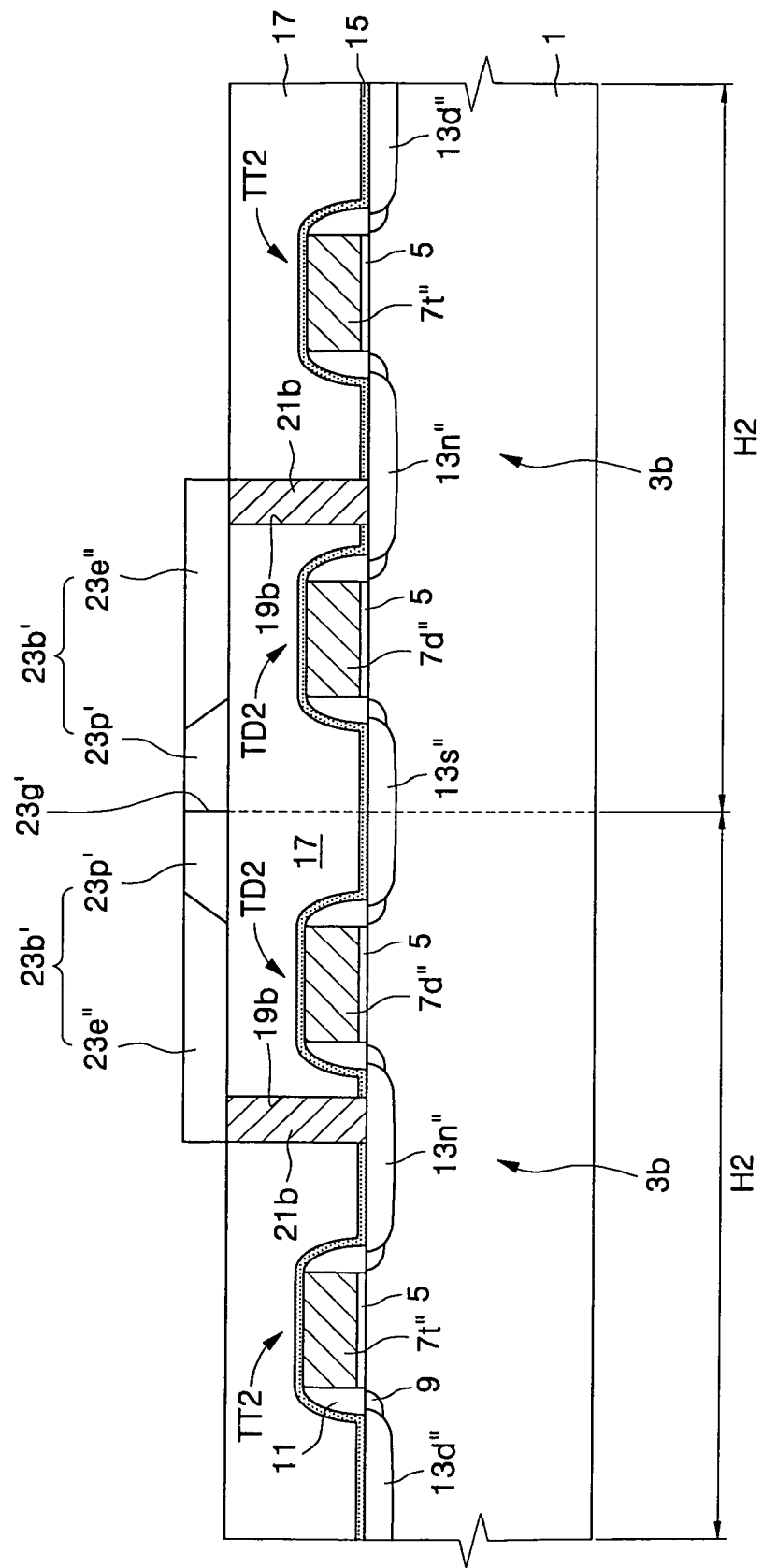

FIGS. 9A, 10A and 11A are cross-sectional views taken along line I-I' of FIG. 2 in order to illustrate TFT SRAM cells according to other embodiments of the invention and methods of fabricating the same, and FIGS. 9B, 10B and 11B are cross-sectional views taken along line II-II' of FIG. 2 in order to illustrate TFT SRAM cells according to other embodiments of the invention and methods of fabricating the same.

Figure 3A:
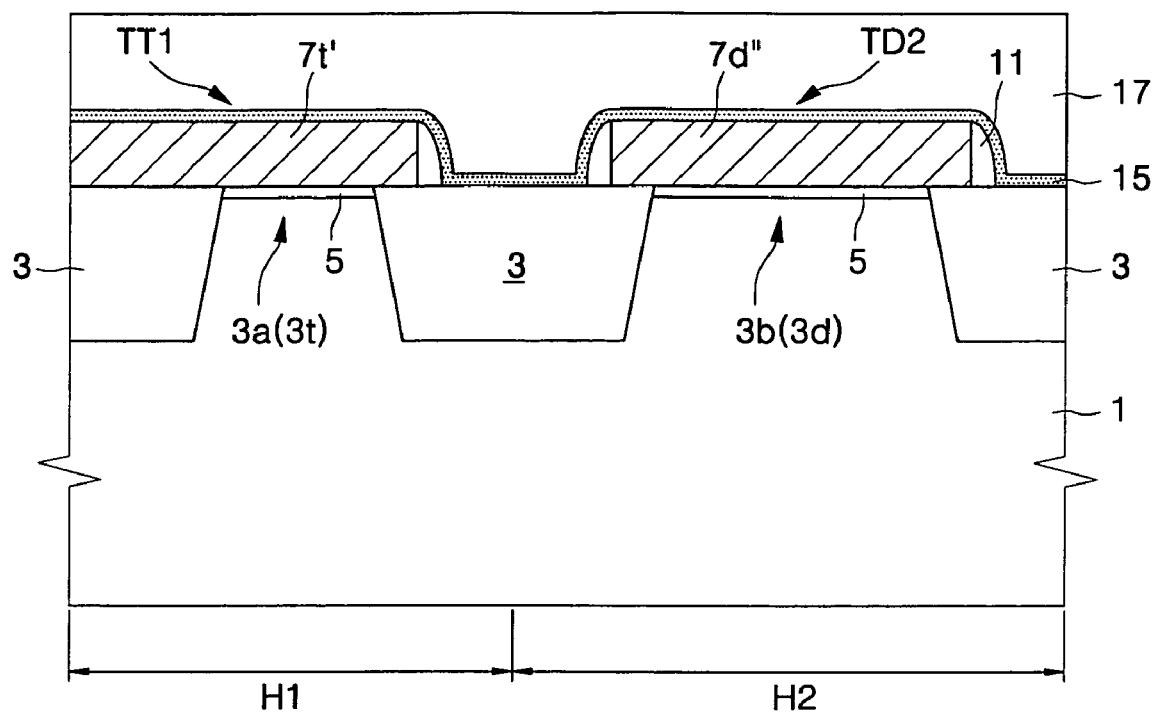
FIGS. 3A, 4A, 5A, 6A, 7A and 8A are cross-sectional views taken along line I-I' of FIG. 2 to illustrate methods of fabricating CMOS SRAM cells employing TFTs in accordance with embodiments of the invention.
Figure 3B:
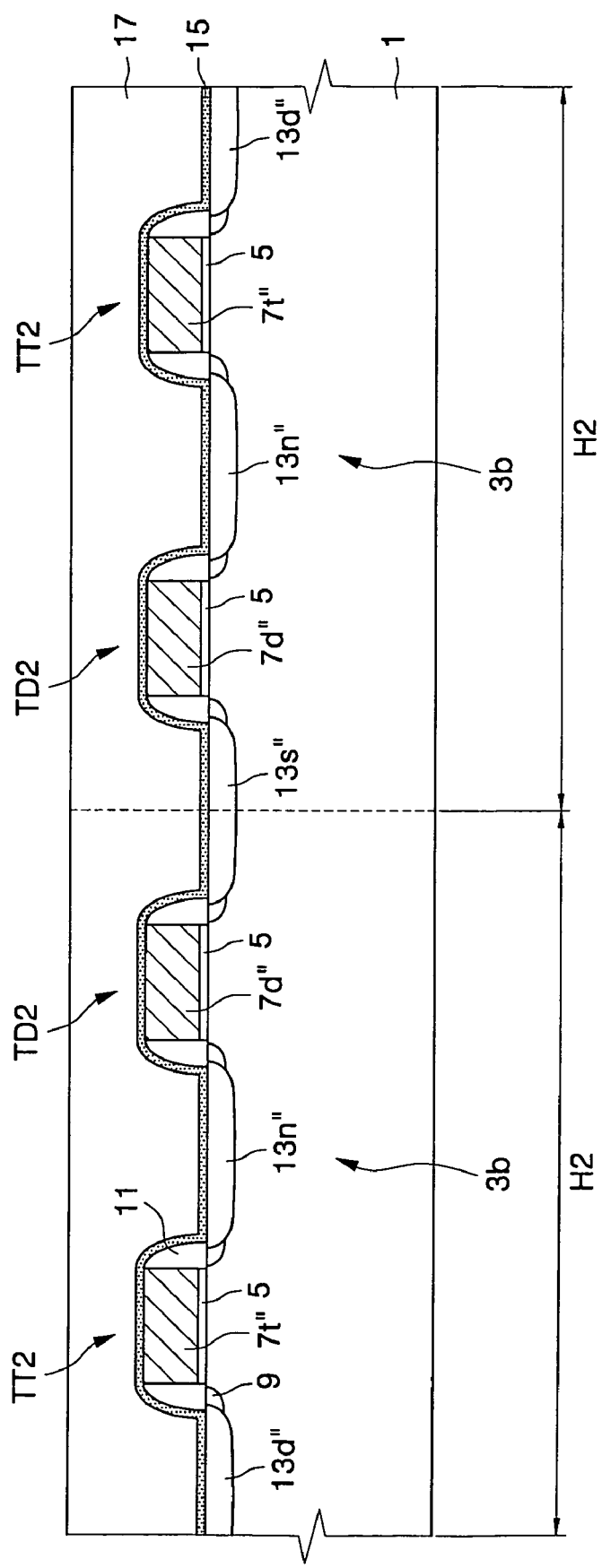
FIGS. 3B, 4B, 5B, 6B, 7B and 8B are cross-sectional views taken along line II-II' of FIG. 2 to illustrate methods of fabricating CMOS SRAM cells employing TFTs in accordance with embodiments of the invention.
Figure 5A:
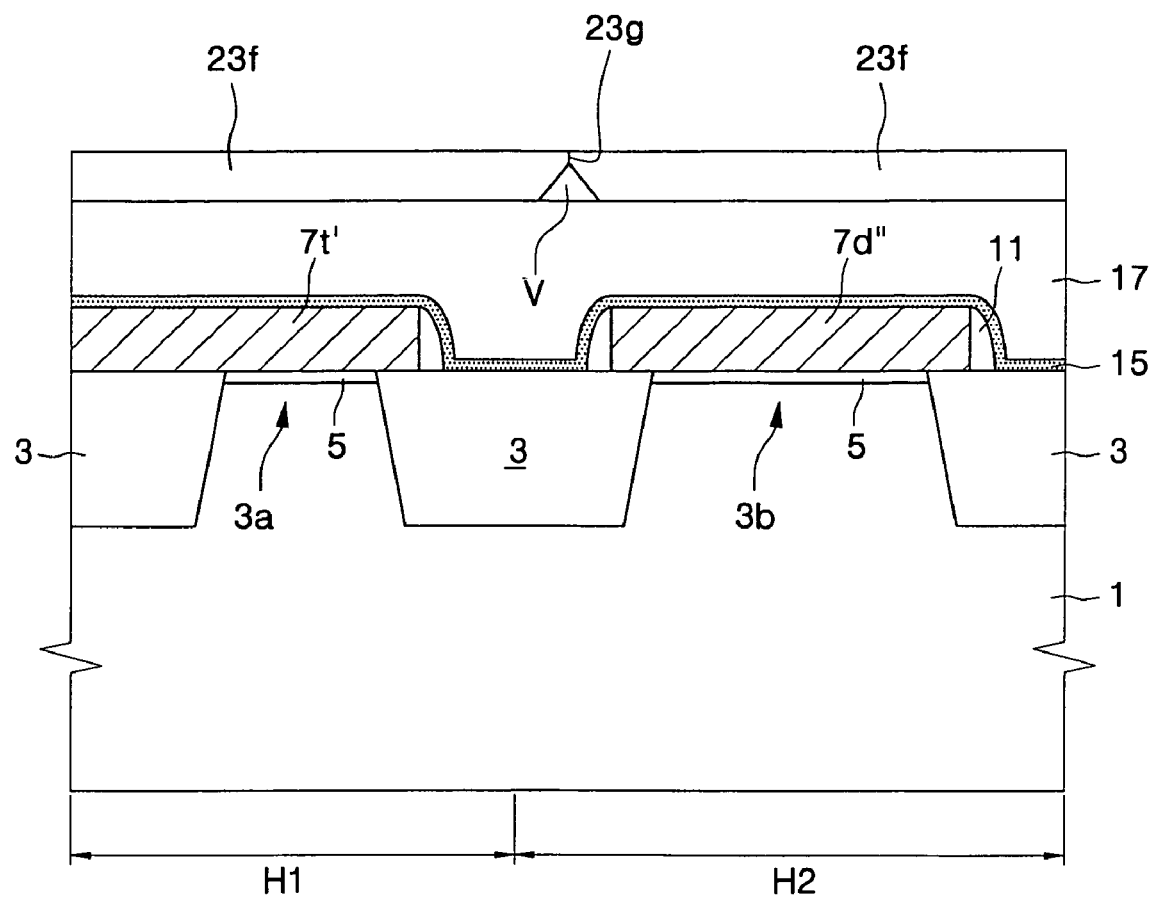
Figure 5B:
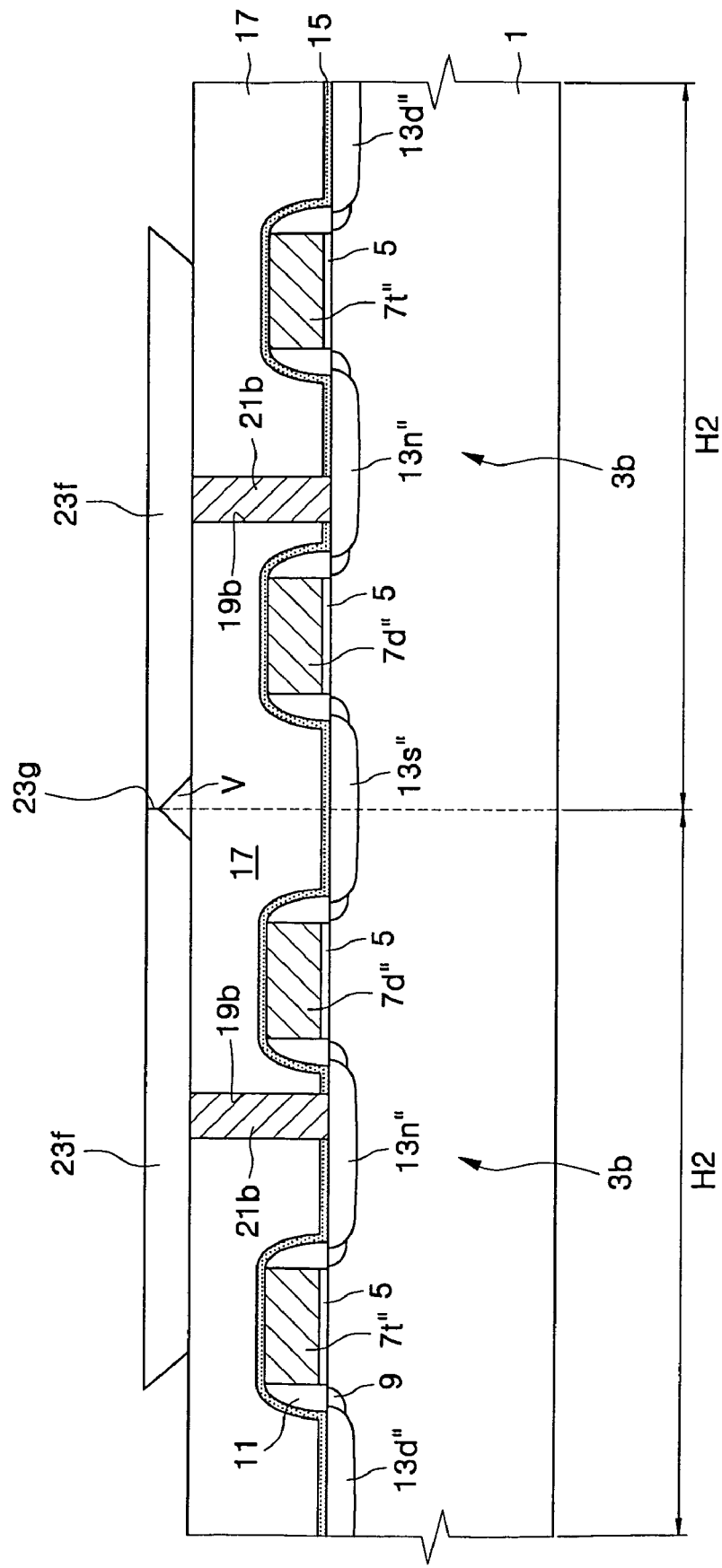
Figure 6A:
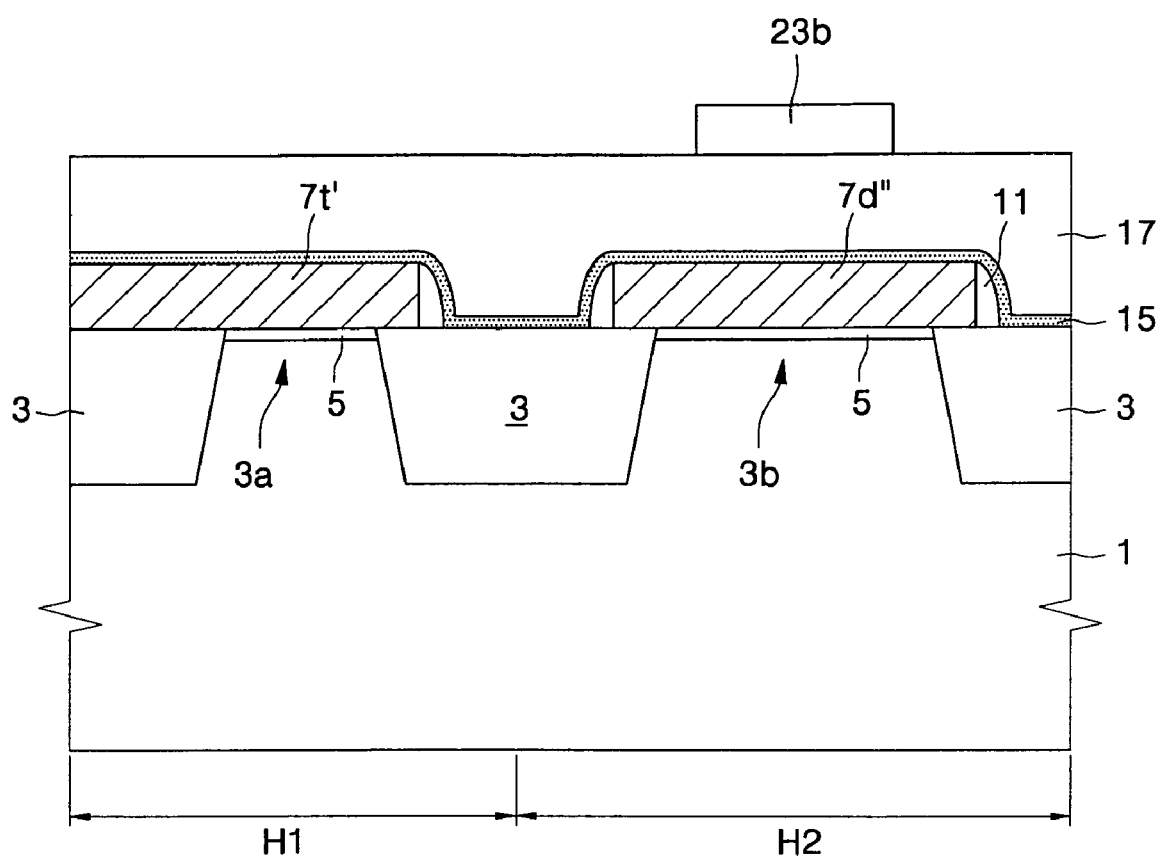
Figure 6B:
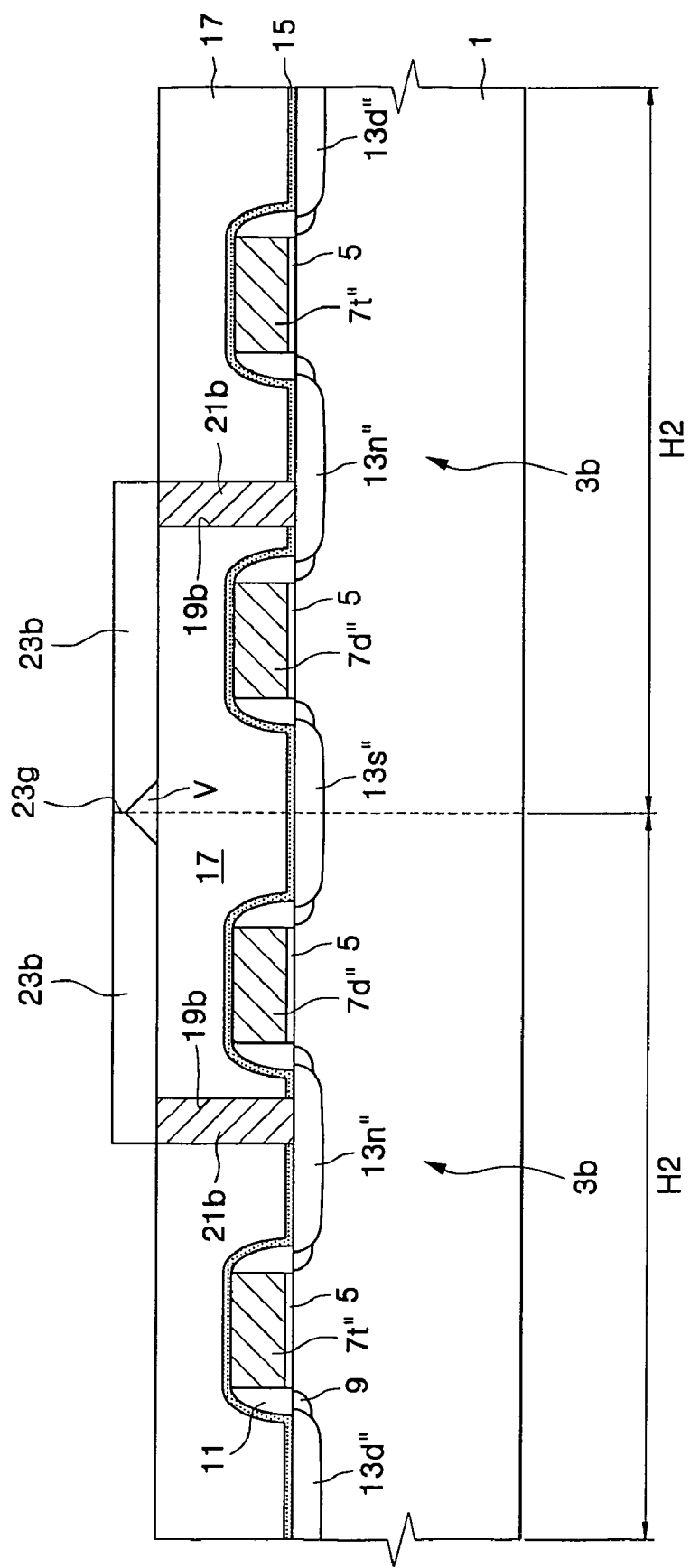

Referring to FIGS. 2, 9A and 9B, first and second driver transistors TD1 and TD2, first and second transfer transistors TT1 and TT2, an inter-layer insulating layer 17, node semiconductor plugs 21b and single-crystalline epitaxial semiconductor patterns 23e' are formed on a semiconductor substrate 1 using substantially the same methods as described with reference to FIGS. 3A, 4A and 5A as well as FIGS. 3B, 4B and 5B. In these embodiments, the single-crystalline epitaxial semiconductor patterns 23e' are preferably formed not to be in contact with each other. In this case, undercut regions may be formed below edges of the separated single-crystalline epitaxial semiconductor patterns 23e' as described above.

A non-single-crystalline semiconductor layer 23p such as an amorphous semiconductor layer or a polycrystalline semiconductor layer is formed on the substrate 1 having the separated single-crystalline epitaxial semiconductor patterns 23e'. The non-single-crystalline semiconductor layer 23p may be formed using a thin film deposition technique exhibiting excellent step coverage. For example, the non-single-crystalline semiconductor layer 23p may be formed using a chemical vapor deposition (CVD) technique or an atomic layer deposition (ALD) technique. Accordingly, the non-single-crystalline semiconductor layer 23p may be formed to fill the undercut regions below the edges of the single-crystalline epitaxial semiconductor patterns 23e'. When the single-crystalline epitaxial semiconductor patterns 23e' are single-crystalline silicon patterns, the non-single-crystalline semiconductor layer 23p may be formed of amorphous silicon or polycrystalline silicon.

The non-single-crystalline semiconductor layer 23p may be crystallized using a typical solid phase epitaxial technique. The single-crystalline epitaxial semiconductor patterns 23e' act as seed layers during the solid phase epitaxial process. As a result, grain boundaries 23g' may be formed at border regions between the half-cell regions H1 and H2 as shown in FIGS. 9A and 9B.

Referring to FIGS. 2, 10A and 10B, the crystallized semiconductor layer (i.e., single-crystalline semiconductor layer) and the single-crystalline epitaxial semiconductor patterns 23e' are at least partially planarized to form single-crystalline semiconductor body layers 23f having a uniform thickness on the inter-layer insulating layer 17 and the node semiconductor plugs 21b. As a result, each of the single-crystalline semiconductor body layers 23f may include a planarized single-crystalline epitaxial semiconductor pattern 23e" and a planarized single-crystalline semiconductor layer 23p'. The partial planarization process may be performed using a CMP process.

In other embodiments of the invention, the solid phase epitaxial process may be performed after the planarization process. In this case, when the non-single-crystalline semiconductor layer and the single-crystalline epitaxial semiconductor pattern are at least partially planarized, non-single-crystalline semiconductor body layers may be formed instead of the single-crystalline semiconductor body layers 23f. The non-single-crystalline semiconductor body layers, i.e., the planarized non-single-crystalline semiconductor layers may be crystallized during the solid phase epitaxial process.

Referring to FIGS. 2, 11A and 11B, the single-crystalline semiconductor body layers 23f are patterned to form single-crystalline semiconductor bodies 23b' in the second half-cell regions H2. While the single-crystalline semiconductor body layers 23f are patterned, other single-crystalline semiconductor bodies 23a' may also be formed in the first half-cell regions H1. Each of the single-crystalline semiconductor bodies 23a' and 23b' may also include the planarized single-crystalline semiconductor layer 23p' and the planarized single-crystalline epitaxial semiconductor pattern 23e". The single-crystalline semiconductor bodies 23a' and 23b' may be formed to cover the node semiconductor plugs and cross over the driver gate electrodes 7d' and 7d".

According to the embodiments described above, the voids V shown in FIGS. 5A and 5B can be prevented from being formed. Accordingly, reliability of the single-crystalline semiconductor bodies 23a' and 23b' may be enhanced.

Subsequently, although not shown in the figures, the load thin film transistors TL1 and TL2, the metal gate plugs 41b and the metal drain plugs 45n" may be formed on the substrate 1 having the single-crystalline semiconductor bodies 23a' and 23b', using the same or similar methods as described with reference to FIGS. 7A, 7B, 8A and 8B.

The invention is not limited to the above-mentioned embodiments, but may be applied to various other semiconductor integrated circuits. For example, the invention may also be applied to a three-dimensional CMOS SRAM cell having double-stacked thin film transistors as shown in FIG. 12.

Figure 12:
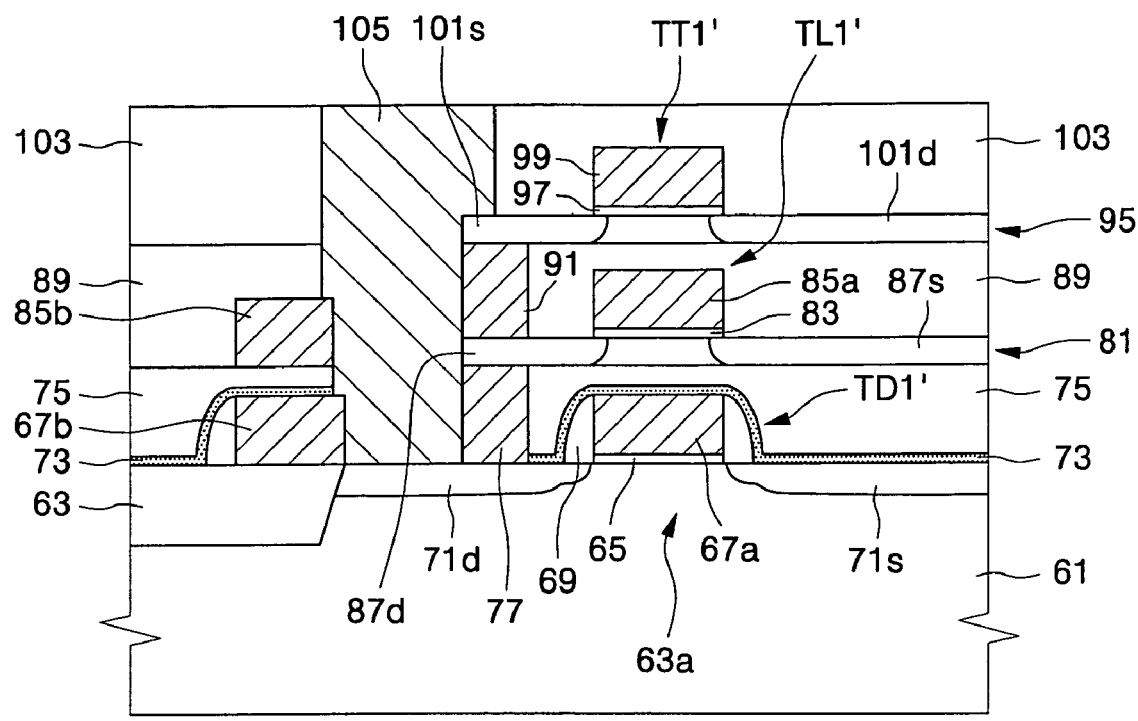
FIG. 12 is a cross-sectional view illustrating a half-cell of other CMOS SRAM cells employing TFTs in accordance with embodiments of the invention.

FIG. 12 is a cross-sectional view illustrating a first half-cell of a CMOS SRAM cell having a pair of bulk MOS transistors, a pair of load thin film transistors and a pair of transfer thin film transistors according an aspect of the present invention.

Referring to FIG. 12, an isolation layer 63 is provided on a predetermined region of a semiconductor substrate 61 to define an active region 63a. A first driver transistor TD1' is provided in the active region 63a. The first driver transistor TD1' includes a source region 71s and a drain region 71d formed in the active region 63a and a first driver gate electrode 67a extending across a channel region between the source/drain regions 71s and 71d. In addition, a second driver transistor (not shown) may be formed in a second half-cell region adjacent to the first half-cell region. A second driver gate electrode 67b of the second driver transistor may extend to cover the isolation layer 63 adjacent to the drain region 71d in the first half-cell region.

The first driver gate electrode 67a is insulated from the active region 63a by a gate insulating layer 65. Sidewalls of the first and second driver gate electrodes 67a and 67b are covered with spacers 69. An etch stop layer 73 is provided on the substrate 61 having the driver transistors, and an inter-layer insulating layer 75 is stacked on the etch stop layer 73. The drain region 71d is in contact with a node semiconductor plug 77 having a single-crystalline structure which penetrates the inter-layer insulating layer 75 and the etch stop layer 73.

A single-crystalline semiconductor body 81 is disposed on the inter-layer insulating layer 75. The node semiconductor plug 77 and the single-crystalline semiconductor body 81 may be fabricated using the methods of forming the node semiconductor plug 21b and the single-crystalline semiconductor bodies 23a and 23b described with reference to FIGS. 2, 4A, 4B, 5A, 5B, 6A and 6B. Alternatively, the node semiconductor plug 77 and the single-crystalline semiconductor body 81 may be fabricated using the methods of forming the node semiconductor plug 21b and the single-crystalline semiconductor bodies 23a' and 23b' described with reference to FIGS. 2, 9A, 9B, 10A, 10B, 11A and 11B.

A first load thin film transistor TL1' is provided at the single-crystalline semiconductor body 81. The first load thin film transistor TL1' may be fabricated using the methods of forming the load thin film transistors TL1 and TL2 described with reference to FIGS. 2, 7A and 7B. That is, the first load thin film transistor TL1' includes a first load gate electrode 85a which extends across the single-crystalline semiconductor body 81 and covers both sidewalls (not shown) of the single-crystalline semiconductor body 81, a drain region 87d which is adjacent to the first load gate electrode 85a and is located on the node semiconductor plug 77, and a source region 87s which is adjacent to the first load gate electrode 85a and is located opposite to the drain region 87d. In addition, the first load gate electrode 85a is insulated from the single-crystalline semiconductor body 81 by a gate insulating layer 83.

Further, a second load thin film transistor (not shown) may be formed in a second half-cell region adjacent to the first half-cell region. A second load gate electrode 85b of the second load thin film transistor may extend to be adjacent to the drain region 87d in the first half-cell region.

A second inter-layer insulating layer 89 is provided on the substrate 61 having the first load thin film transistor TL1' and the second load thin film transistor (not shown). The drain region 87d is in contact with a second node semiconductor plug 91 that penetrates the second inter-layer insulating layer 89. The second node semiconductor plug 91 may be fabricated using the methods of forming the node semiconductor plugs 21b described with reference to FIG. 4B.

A second single-crystalline semiconductor body 95 is disposed on the second inter-layer insulating layer 89. The second node semiconductor plug 91 and the second single-crystalline semiconductor body 95 may be fabricated using the methods of forming the node semiconductor plug 21b and the single-crystalline semiconductor bodies 23a and 23b described with reference to FIGS. 2, 4A, 4B, 5A, 5B, 6A and 6B. Alternatively, the second node semiconductor plug 91 and the second single-crystalline semiconductor body 95 may be fabricated using the methods of forming the node semiconductor plug 21b and the single-crystalline semiconductor bodies 23a' and 23b' described with reference to FIGS. 2, 9A, 9B, 10A, 10B, 11A and 11B.

A first transfer thin film transistor TT1' is provided on the second single-crystalline semiconductor body 95. The first transfer thin film transistor TT1' may be manufactured using the methods of forming the load thin film transistors TL1 and TL2 described with reference to FIGS. 2, 7A and 7B. That is, the first transfer thin film transistor TT1' includes a first transfer gate electrode 99 which crosses over the second single-crystalline semiconductor body 95 and covers both sidewalls (not shown) of the second single-crystalline semiconductor body 95, a source region 101s which is adjacent to the first transfer gate electrode 99 and is located on the second node semiconductor plug 91, and a drain region 101d which is adjacent to the first transfer gate electrode 99 and is located opposite to the source region 101s. In addition, the first transfer gate electrode 99 is insulated from the second single-crystalline semiconductor body 95 by a gate insulating layer 97. Moreover, a second transfer thin film transistor (not shown) may be formed in the second half-cell region. The first transfer gate electrode 99 extends to serve as a gate electrode of the second transfer thin film transistor.

A third inter-layer insulating layer 103 is provided overlying the first transfer thin film transistor TT1' and the second transfer thin film transistor (not shown). The drain regions 71d and 87d, the node semiconductor plugs 77 and 91, the source region 101s, the second driver gate electrode 67b and the second load gate electrode 85b may be electrically coupled to one another through a metal node plug 105 that penetrates the inter-layer insulating layers 75, 89 and 103 and the etch stop layer 73.

According to the embodiments of the invention mentioned above, a single-crystalline semiconductor plug is formed to penetrate an inter-layer insulating layer, and a single-crystalline epitaxial semiconductor pattern is grown on the inter-layer insulating layer using the single-crystalline semiconductor plug as a seed layer. The single-crystalline epitaxial semiconductor pattern is at least partially planarized to form a single-crystalline semiconductor body layer on the inter-layer insulating layer, and the single-crystalline semiconductor body layer is patterned to form a single-crystalline semiconductor body. As a result, the single-crystalline semiconductor body having a uniform thickness and an excellent single-crystalline structure may be formed. Accordingly, if a thin film transistor is formed at the single-crystalline semiconductor body, integration density, reliability and electrical characteristics of a semiconductor integrated circuit can be remarkably improved.

Having described exemplary embodiments of the invention, it is noted that modifications and variations can be made by persons skilled in the art in light of the above teachings. Therefore, it is to be understood that changes to embodiments of the invention disclosed that are nevertheless still within the spirit and scope of the invention as defined by the appended claims.

What is claimed is:

1. A method of fabricating a semiconductor integrated circuit, the method comprising:

forming an inter-layer insulating layer on a single-crystalline semiconductor substrate;

forming a single-crystalline semiconductor plug penetrating the inter-layer insulating layer;

forming a single-crystalline epitaxial semiconductor pattern covering the inter-layer insulating layer, the single-crystalline epitaxial semiconductor pattern being in contact with the single-crystalline semiconductor plug;

at least partially planarizing the single-crystalline epitaxial semiconductor pattern to form a semiconductor body layer on the inter-layer insulating layer; and patterning the semiconductor body layer to form a semiconductor body.

2. The method according to claim 1, wherein the single-crystalline semiconductor plug and the single-crystalline epitaxial semiconductor pattern are formed in-situ.

3. The method according to claim 1, wherein forming the single-crystalline semiconductor plug and forming the single-crystalline epitaxial semiconductor pattern comprises:

patterning the inter-layer insulating layer to form a contact hole exposing the single-crystalline semiconductor substrate;

growing a doped single-crystalline epitaxial semiconductor layer filling the contact hole using an SEG technique that employs the exposed single-crystalline semiconductor substrate as a seed layer; and forming a single-crystalline epitaxial semiconductor layer covering the doped single-crystalline epitaxial semiconductor layer and the inter-layer insulating layer using an SEG technique that employs the doped single-crystalline epitaxial semiconductor layer as a seed layer.

4. The method according to claim 3, further comprising:
planarizing the doped single-crystalline epitaxial semiconductor layer before forming the single-crystalline epitaxial semiconductor layer covering the inter-layer insulating layer; and
cleaning a surface of the planarized single-crystalline epitaxial semiconductor layer.

5. The method according to claim 1, wherein at least partially planarizing the single-crystalline epitaxial semiconductor pattern is performed by a CMP technique.

6. The method according to claim 1, further comprising:
forming a non-single-crystalline semiconductor layer overlying the single-crystalline epitaxial semiconductor pattern before forming the semiconductor body layer; and
crystallizing the non-single-crystalline semiconductor layer using a solid phase epitaxial technique that employs the single-crystalline epitaxial semiconductor pattern as a seed layer,
wherein the semiconductor body layer is formed by at least partially planarizing the crystallized semiconductor layer and the single-crystalline epitaxial semiconductor pattern.

7. The method according to claim 6, wherein the non-single-crystalline semiconductor layer comprises an amorphous semiconductor layer or a polycrystalline semiconductor layer.

8. The method according to claim 1, further comprising:
forming a non-single-crystalline semiconductor layer overlying the single-crystalline epitaxial semiconductor pattern before forming the semiconductor body layer; and
performing a solid phase epitaxial process using the single-crystalline epitaxial semiconductor pattern as a seed layer before patterning the semiconductor body layer,
wherein the semiconductor body layer is formed by at least partially planarizing the non-single-crystalline semiconductor layer and the single-crystalline epitaxial semiconductor pattern, and the planarized non-single-crystalline semiconductor layer is crystallized during the solid phase epitaxial process.

9. The method according to claim 1, further comprising forming a thin film transistor on the semiconductor body.

10. The method according to claim 9, wherein forming the thin film transistor comprises:
forming a gate electrode extending across the semiconductor body, the gate electrode covering sidewalls of the semiconductor body; and
implanting impurity ions into the semiconductor body, using the gate electrode as an ion implantation mask, to form source and drain regions therein.

11. The method according to claim 1, further comprising:
forming an isolation layer on a predetermined region of the single-crystalline semiconductor substrate to define an active region before forming the inter-layer insulating layer; and
forming a bulk metal oxide semiconductor (MOS) transistor in the active region,
wherein the bulk MOS transistor includes a gate electrode extending across the active region and source/drain regions located on both sides of a channel region below the gate electrode.

12. The method according to claim 11, wherein the single-crystalline semiconductor plug is in contact with at least one of the source/drain regions of the bulk MOS transistor.

13. A method of fabricating a thin film transistor static random access memory (TFT SRAM) cell composed of first and second half-cells, the method of fabricating one of the first and second half-cells comprising:
forming an isolation layer on a predetermined region of a single-crystalline semiconductor substrate to define an active region;
forming a driver transistor at the active region, the driver transistor having a driver gate electrode extending across the active region and source/drain regions located on both sides of a channel region below the driver gate electrode;
forming an inter-layer insulating layer overlying the driver transistor;
forming a single-crystalline semiconductor plug penetrating the inter-layer insulating layer to contact the drain region of the driver transistor;
forming a single-crystalline epitaxial semiconductor pattern covering the inter-layer insulating layer, the single-crystalline epitaxial semiconductor pattern being in contact with the single-crystalline semiconductor plug;
planarizing the single-crystalline epitaxial semiconductor pattern to form a semiconductor body layer on the inter-layer insulating layer; and
patterning the semiconductor body layer to form a semiconductor body.

14. The method according to claim 13, wherein forming the single-crystalline semiconductor plug and forming the single-crystalline epitaxial semiconductor pattern comprises:
patterning the inter-layer insulating layer to form a node contact hole exposing the drain region of the driver transistor; and
growing a single-crystalline epitaxial semiconductor layer that fills the node contact hole and covers the inter-layer insulating layer, using an SEG technique employing the exposed drain region as a seed layer.

15. The method according to claim 13, wherein forming the single-crystalline semiconductor plug and forming the single-crystalline epitaxial semiconductor pattern comprises:
patterning the inter-layer insulating layer to form a node contact hole exposing the drain region of the driver transistor;
growing a doped single-crystalline epitaxial semiconductor layer filling the node contact hole, using an SEG technique employing the exposed drain region as a seed layer; and
forming a single-crystalline epitaxial semiconductor layer covering the doped single-crystalline epitaxial semiconductor layer and the inter-layer insulating layer using an SEG technique employing the doped single-crystalline epitaxial semiconductor layer as a seed layer.

16. The method according to claim 15, further comprising:
planarizing the doped single-crystalline epitaxial semiconductor layer; and
cleaning a surface of the planarized single-crystalline epitaxial semiconductor layer.

17. The method according to claim 13, wherein planarizing the single-crystalline epitaxial semiconductor pattern comprises CMP.

18. The method according to claim 13, further comprising:

forming a non-single-crystalline semiconductor layer overlying the single-crystalline epitaxial semiconductor pattern before forming the semiconductor body layer; and crystallizing the non-single-crystalline semiconductor layer using a solid phase epitaxial technique employing the single-crystalline epitaxial semiconductor pattern as a seed layer, wherein the semiconductor body layer is formed by at least partially planarizing the crystallized semiconductor layer and the single-crystalline epitaxial semiconductor pattern.

19. The method according to claim 18, wherein the non-single-crystalline semiconductor layer is formed of an amorphous semiconductor layer or a polycrystalline semiconductor layer.

20. The method according to claim 13, further comprising:

forming a non-single-crystalline semiconductor layer overlying the single-crystalline epitaxial semiconductor pattern before forming the semiconductor body layer; and performing a solid phase epitaxial process using the single-crystalline epitaxial semiconductor pattern as a seed layer before patterning the semiconductor body layer, wherein the semiconductor body layer is formed by at least partially planarizing the non-single-crystalline semiconductor layer and the single-crystalline epitaxial semiconductor pattern, and the planarized non-single-crystalline semiconductor layer is crystallized during the solid phase epitaxial process.

21. The method according to claim 13, further comprising forming a load thin film transistor serving as a load transistor at the semiconductor body, wherein the load thin film transistor includes a load gate electrode extending across the semiconductor body and covering sidewalls of the semiconductor body, a drain region adjacent to the load gate electrode and located on the single-crystalline semiconductor plug, and a source region adjacent to the load gate electrode and located opposite to the drain region.

22. The method according to claim 21, further comprising:

forming a second inter-layer insulating layer over the load thin film transistor;

forming a second single-crystalline semiconductor plug penetrating the second inter-layer insulating layer to be in contact with the drain region of the load thin film transistor and a second single-crystalline epitaxial semiconductor pattern covering the second inter-layer insulating layer, the second single-crystalline epitaxial semiconductor pattern being in contact with the second single-crystalline semiconductor plug;

at least partially planarizing the second single-crystalline epitaxial semiconductor pattern to form a second semiconductor body layer on the second inter-layer insulating layer; and patterning the second semiconductor body layer to form a second semiconductor body that is in contact with the second single-crystalline semiconductor plug.

23. The method according to claim 22, wherein forming the second single-crystalline semiconductor plug and the second single-crystalline epitaxial semiconductor pattern comprises:

patterning the second inter-layer insulating layer to form a second node contact hole exposing the drain region of the load thin film transistor; and growing a single-crystalline epitaxial semiconductor layer filling the second node contact hole and covering the second inter-layer insulating layer using an SEG technique that employs the exposed drain region as a seed layer.

24. The method according to claim 22, wherein forming the second single-crystalline semiconductor plug and the second single-crystalline epitaxial semiconductor pattern comprises:

patterning the second inter-layer insulating layer to form a second node contact hole exposing the drain region of the load thin film transistor;

growing a doped single-crystalline epitaxial semiconductor layer filling the second node contact hole using an SEG technique that employs the exposed drain region as a seed layer; and forming a single-crystalline epitaxial semiconductor layer covering the doped single-crystalline epitaxial semiconductor layer and the second inter-layer insulating layer using a SEG technique that employs the doped single-crystalline epitaxial semiconductor layer as a seed layer.

25. The method according to claim 24, further comprising:

planarizing the doped single-crystalline epitaxial semiconductor layer; and cleaning a surface of the planarized single-crystalline epitaxial semiconductor layer.

26. The method according to claim 22, wherein planarizing the second single-crystalline epitaxial semiconductor pattern comprises CMP.

27. The method according to claim 22, further comprising:

forming a second non-single-crystalline semiconductor layer overlying the second single-crystalline epitaxial semiconductor pattern before forming the second semiconductor body layer; and crystallizing the second non-single-crystalline semiconductor layer using a solid phase epitaxial technique that employs the second single-crystalline epitaxial semiconductor pattern as a seed layer, wherein the second semiconductor body layer is formed by at least partially planarizing the crystallized semiconductor layer and the second single-crystalline epitaxial semiconductor pattern.

28. The method according to claim 27, wherein the second non-single-crystalline semiconductor layer is formed of an amorphous semiconductor layer or a polycrystalline semiconductor layer.

29. The method according to claim 22, further comprising:

forming a second non-single-crystalline semiconductor layer over the second single-crystalline epitaxial semiconductor pattern before forming the second semiconductor body layer; and performing a solid phase epitaxial process employing the second single-crystalline epitaxial semiconductor pattern as a seed layer before patterning the second semiconductor body layer, wherein the second semiconductor body layer is formed by at least partially planarizing the second non-single-crystalline semiconductor layer and the second single-crystalline epitaxial semiconductor pattern, and the planarized non-single-crystalline semiconductor layer is crystallized during the solid phase epitaxial process.

30. The method according to claim 22, further comprising forming a transfer thin film transistor serving as a transfer transistor on the second the semiconductor body, wherein the transfer thin film transistor includes a transfer gate electrode extending across the second semiconductor body and covering both sidewalls of the second semiconductor body, a source region adjacent to the transfer gate electrode and located on the second single-crystalline semiconductor plug, and a drain region adjacent to the transfer gate electrode and located opposite to the source region.

31. The method according to claim 30, further comprising:

forming a third inter-layer insulating layer overlying the transfer thin film transistor; and forming a node metal plug penetrating the first to third inter-layer insulating layers, wherein the node metal plug is formed of a metal layer having an ohmic contact with the drain region of the driver transistor, the single-crystalline semiconductor plug, the drain region of the load thin film transistor, the second single-crystalline semiconductor plug, and the source region of the transfer thin film transistor.

32. The method according to claim 21, further comprising forming a transfer transistor in the active region during formation of the driver transistor, wherein the transfer transistor comprises a transfer gate electrode extending across the active region as well as source/drain regions located on both sides of a channel region below the transfer gate electrode, and the source region of the transfer transistor corresponds to the drain region of the driver transistor.

33. The method according to claim 32, further comprising:

forming a second inter-layer insulating layer on the substrate having the load thin film transistor; and forming a node metal plug penetrating the first and second inter-layer insulating layers, wherein the node metal plug is formed of a metal layer having an ohmic contact with the drain region of the driver transistor, the single-crystalline semiconductor plug, and the drain region of the load thin film transistor.

* * * * *